United States Patent
Hara et al.

(10) Patent No.: US 6,737,672 B2
(45) Date of Patent: May 18, 2004

(54) SEMICONDUCTOR DEVICE, MANUFACTURING METHOD THEREOF, AND SEMICONDUCTOR MANUFACTURING APPARATUS

(75) Inventors: Akito Hara, Kawasaki (JP); Fumiyo Takeuchi, Kawasaki (JP); Kenichi Yoshino, Kawasaki (JP); Nobuo Sasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/935,090

(22) Filed: Aug. 22, 2001

(65) Prior Publication Data
US 2002/0031876 A1 Mar. 14, 2002

(30) Foreign Application Priority Data
Aug. 25, 2000 (JP) ......................... 2000-255646
Jul. 3, 2001 (JP) ......................... 2001-202730

(51) Int. Cl.$^7$ ......................... H01L 31/0376
(52) U.S. Cl. ......................... 257/59; 257/64
(58) Field of Search ......................... 257/57, 59, 64, 257/70

(56) References Cited

U.S. PATENT DOCUMENTS

| | | | |
|---|---|---|---|
| 4,309,225 A | 1/1982 | Fan et al. | |
| 5,710,050 A | 1/1998 | Makita et al. | |
| 5,882,960 A * | 3/1999 | Zhang et al. | 438/166 |
| 5,937,304 A | 8/1999 | Yoshinouchi et al. | |
| 5,953,597 A | 9/1999 | Kusumoto et al. | 438/161 |
| 6,008,101 A | 12/1999 | Tanaka et al. | |
| 6,204,099 B1 | 3/2001 | Kusumoto et al. | 438/151 |
| 6,479,837 B1 * | 11/2002 | Ogawa et al. | 257/59 |
| 6,509,204 B2 | 1/2003 | Campbell | |

FOREIGN PATENT DOCUMENTS

| JP | 407038110 A | * | 2/1995 |
|---|---|---|---|
| JP | 11074198 A | * | 3/1999 |

* cited by examiner

*Primary Examiner*—Caridad Everhart
(74) *Attorney, Agent, or Firm*—Greer, Burns & Crain, Ltd

(57) ABSTRACT

An a-Si film is patterned into a linear shape (ribbon shape) or island shape on a glass substrate. The upper surface of the a-Si film or the lower surface of the glass substrate is irradiated and scanned with an energy beam output continuously along the time axis from a CW laser in a direction indicated by an arrow, thereby crystallizing the a-Si film. This implements a TFT in which the transistor characteristics of the TFT are made uniform at high level, and the mobility is high particularly in a peripheral circuit region to enable high-speed driving in applications to a system-on glass and the like.

9 Claims, 34 Drawing Sheets

MICROCRYSTALLIZATION AT PERIPHERY

SEMICONDUCTOR THIN FILM RIBBON

SEMICONDUCTOR THIN FILM ISLAND

FIG. 2A
SEMICONDUCTOR THIN FILM RIBBON
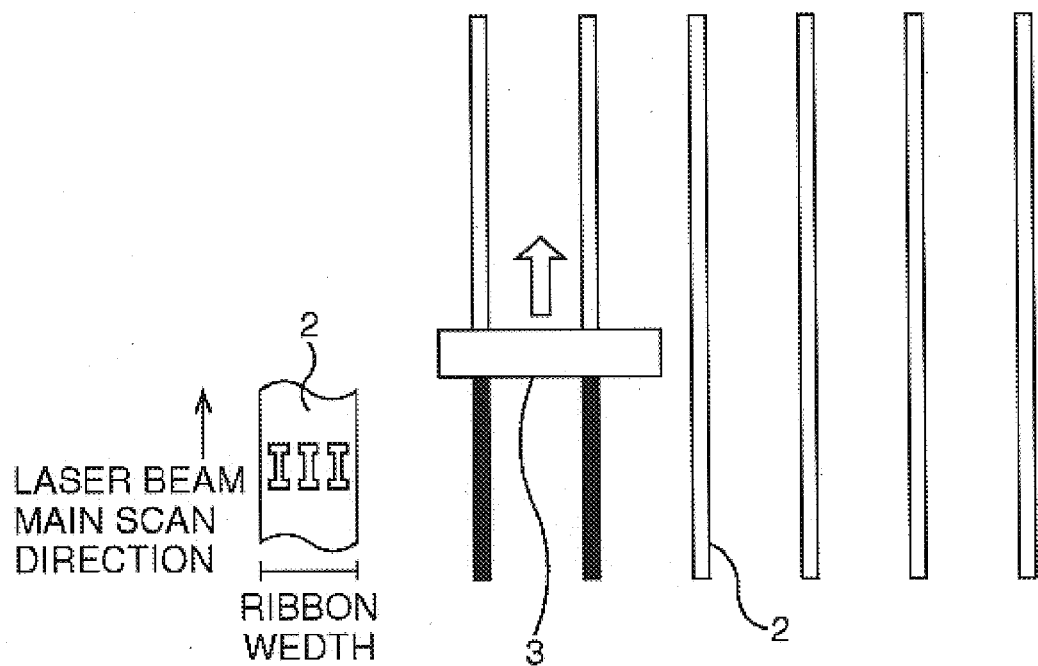
FIG. 2B
PHOTOGRAPH OF SEMICONDUCTOR THIN FILM RIBBON

FLOW PATTERN CRYSTAL

EXCIMER PATTERN CRYSTAL

SECTION TEM

DIFFERENCE IN FLOW PATTERN CRYSTAL BETWEEN 470cm$^2$/Vs AND 250cm$^2$/Vs

FLOW PATTERN AND MOBILITY

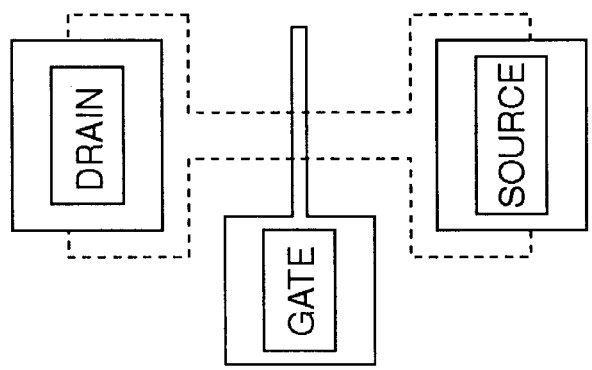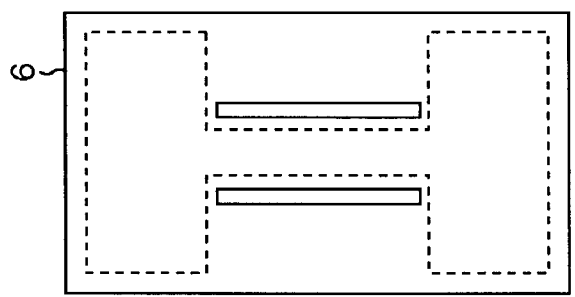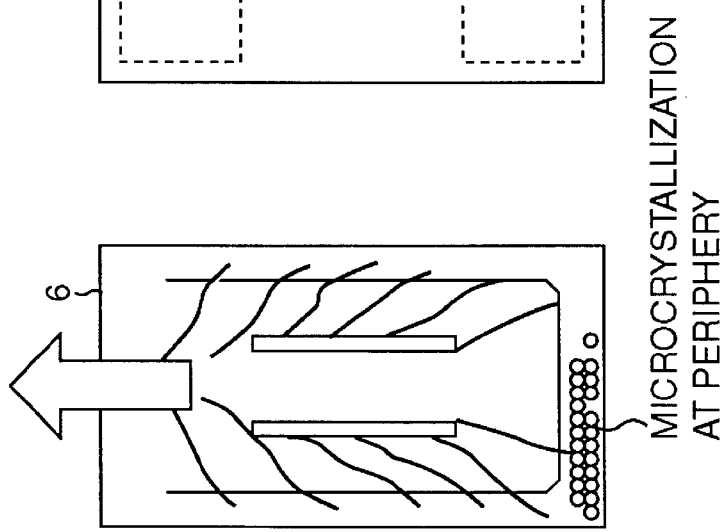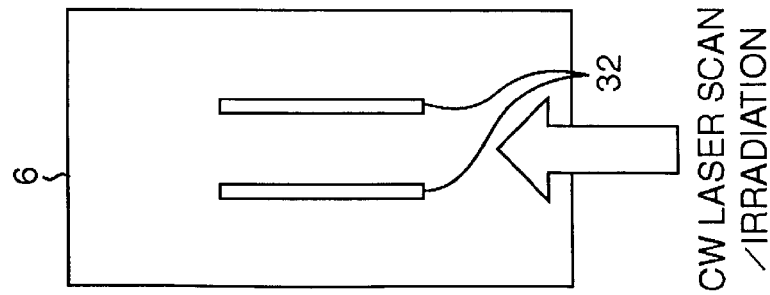

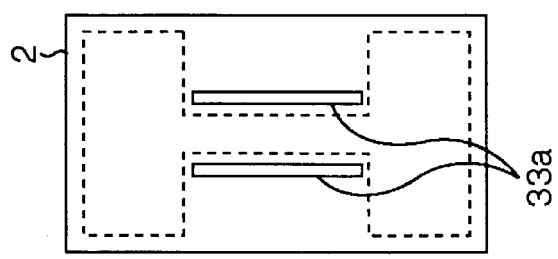
FIG. 16A
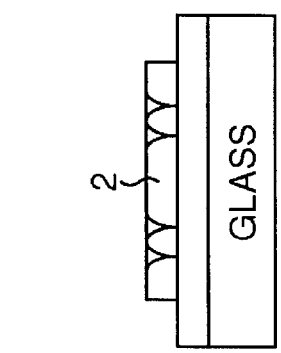
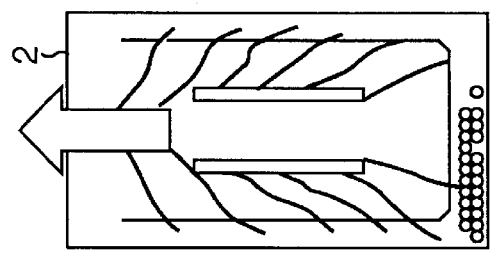
FIG. 16B
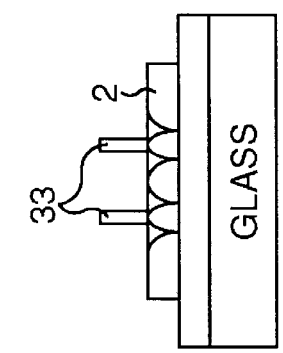
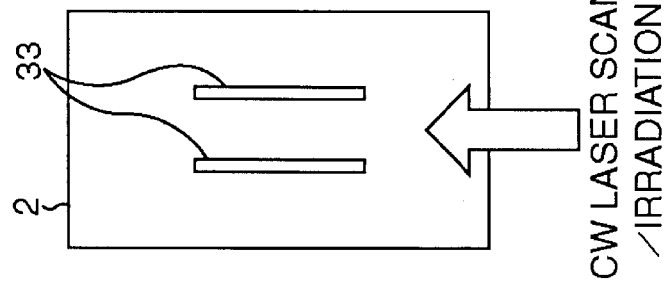
FIG. 16C
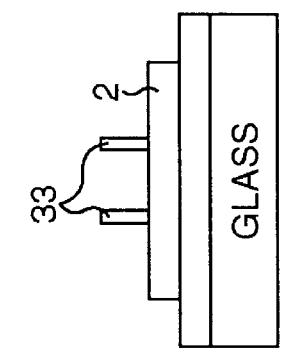
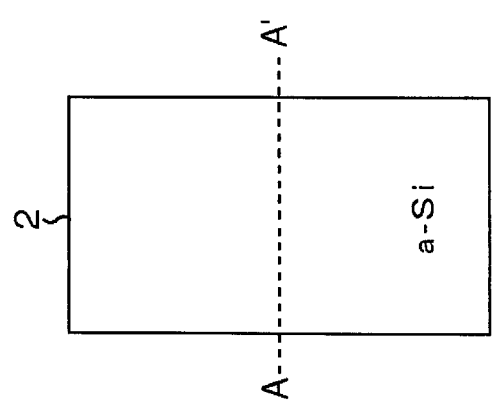
FIG. 16D
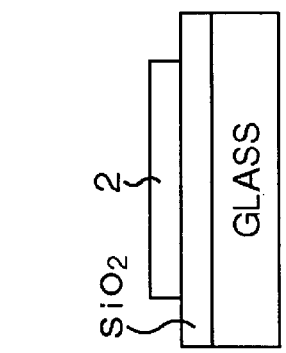

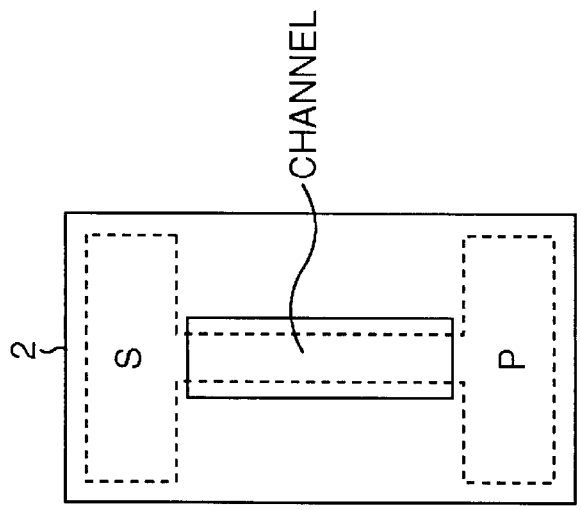
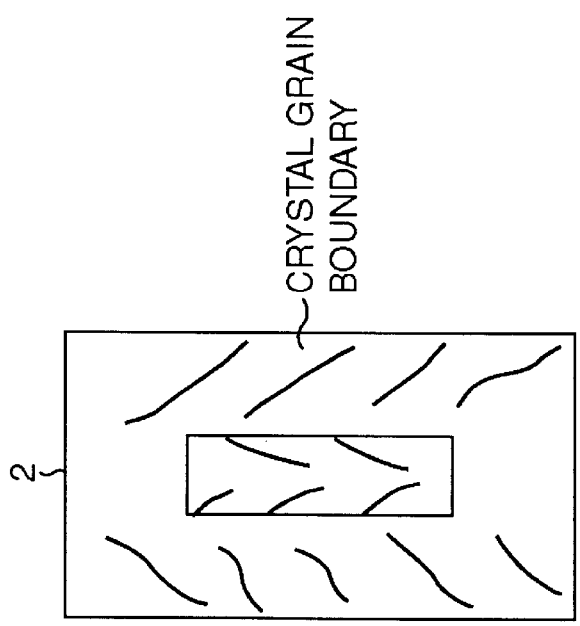
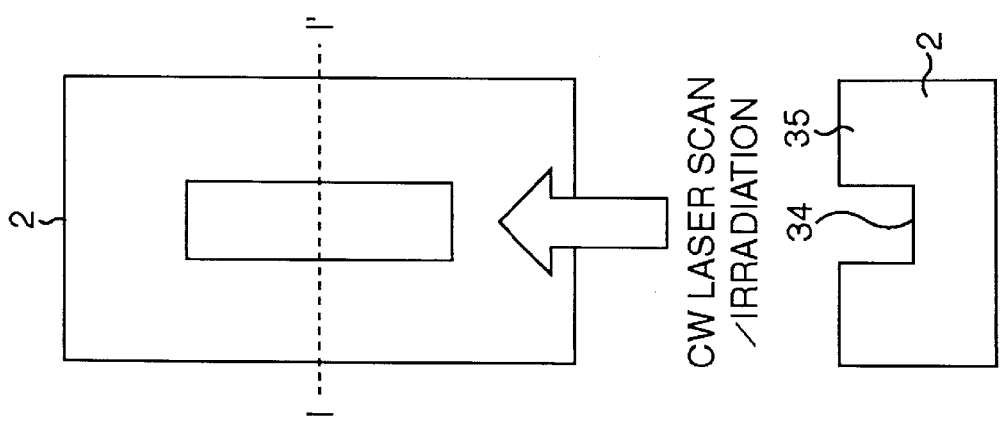

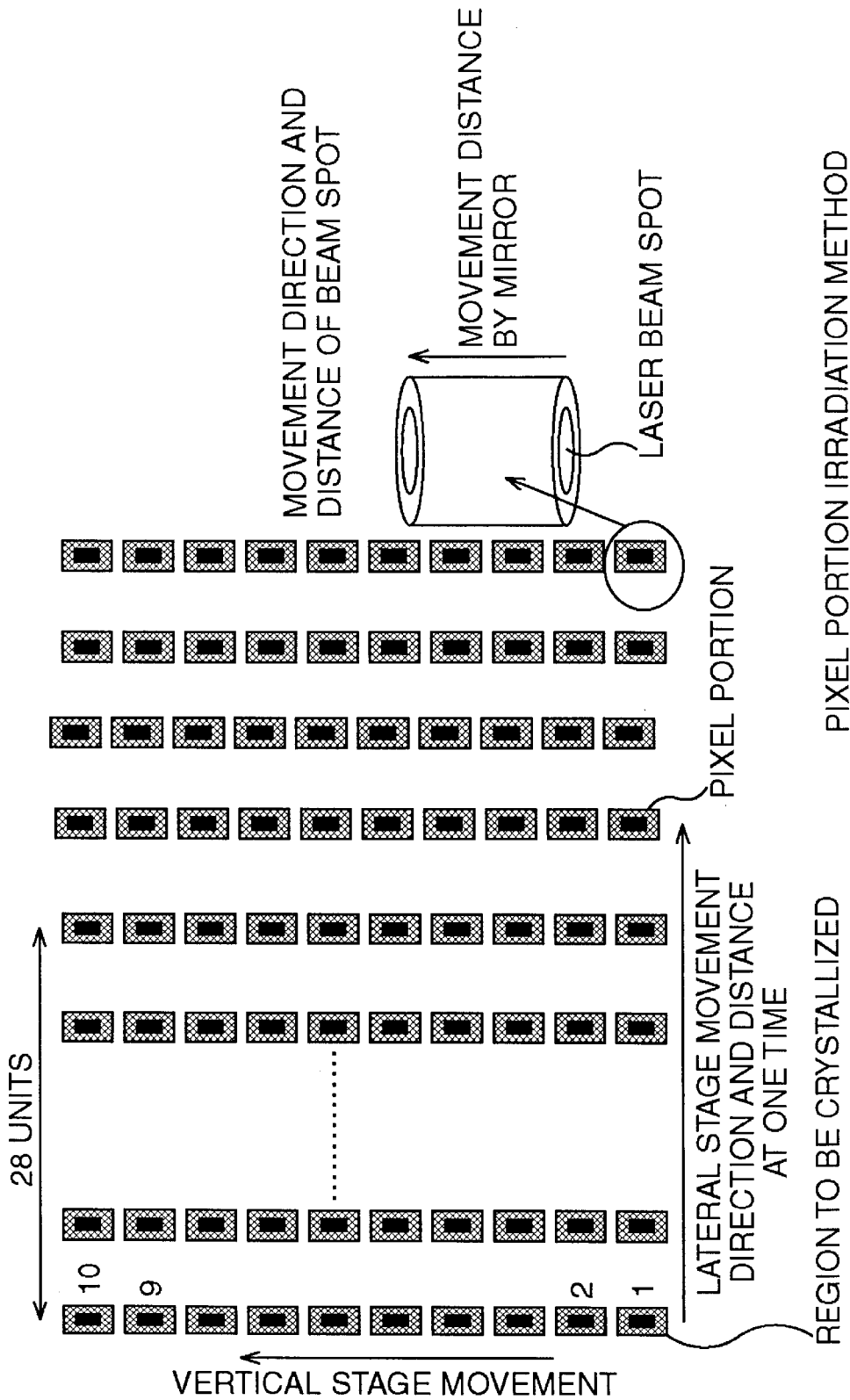

SCANNING METHOD OF PIXEL TFT

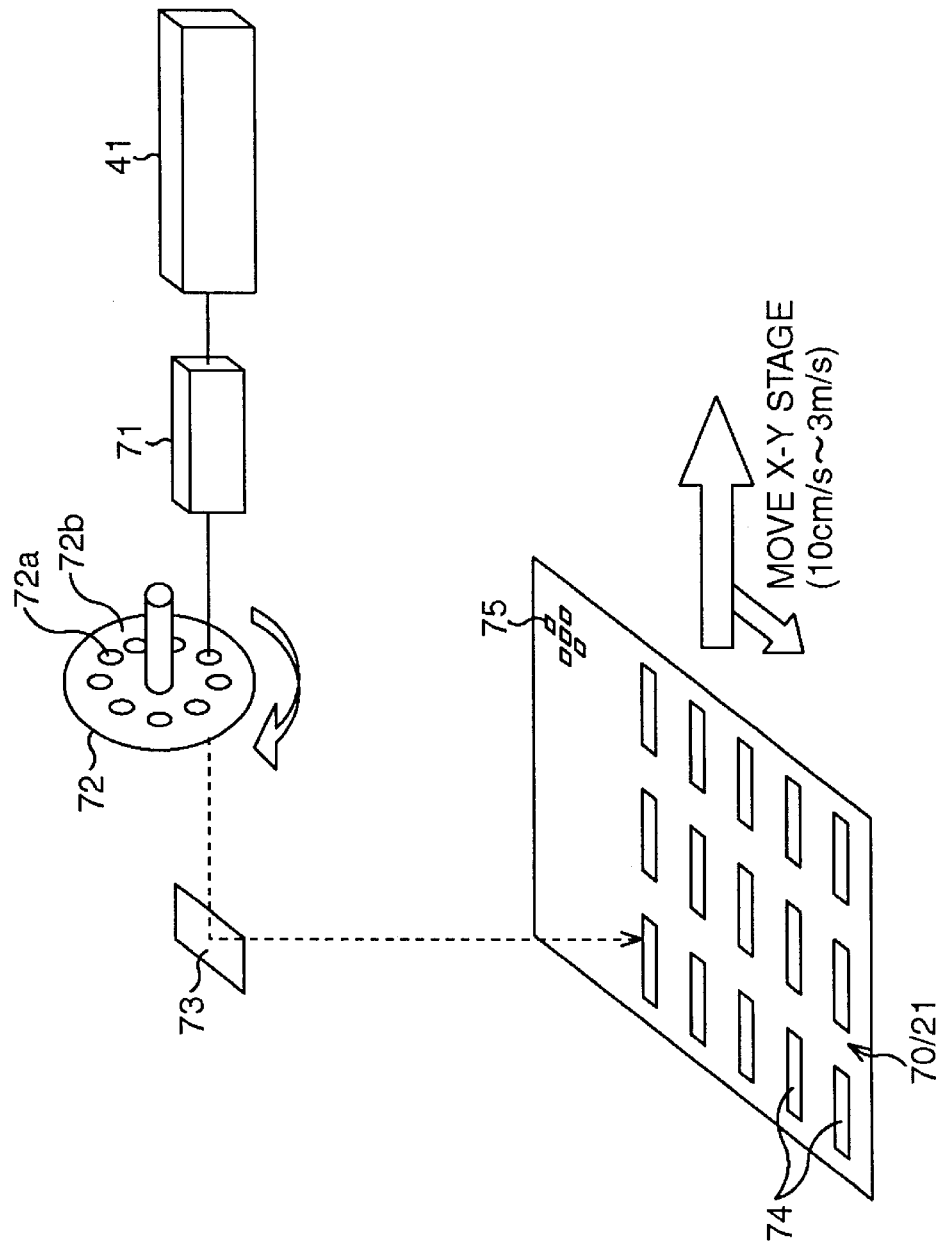

POLYSILICON BY EXCIMER LASER

SEMICONDUCTOR DEVICE, MANUFACTURING METHOD THEREOF, AND SEMICONDUCTOR MANUFACTURING APPARATUS

CROSS-REFERENCE TO RELATED APPLICATIONS

This application is based upon and claims priority of Japanese Patent Application Nos. 2000-255646 and 2001-202730, filed on Aug. 25, 2000 and Jul. 3, 2001, the contents being incorporated herein by reference.

BACKGROUND OF THE INVENTION

1. Field of the Invention

The present invention relates to semiconductor devices, manufacturing methods of the same, and semiconductor manufacturing apparatus, in particular, for being suitably applied to a so-called system-on panel, in which a pixel region including thin film transistors and a peripheral circuit region including thin film transistors are formed on a non-crystallized (amorphous) substrate such as a non-alkali glass substrate.

2. Description of the Related Art

A TFT (Thin Film Transistor) is formed on a very thin, fine active semiconductor film. The TFT is examined to be mounted on a large-screen liquid crystal panel or the like in consideration of recent demands for an increase in area. In particular, applications to a system-on panel and the like are expected.

On the system-on panel, polycrystalline semiconductor TFTs (especially polysilicon TFTs (p-Si TFTs)) are formed on a non-crystallized substrate such as a non-alkali glass substrate. In this case, as a popular method, an amorphous silicon (a-Si) film is formed as a semiconductor film, and then irradiated with an ultraviolet short-pulse excimer laser to fuse and crystallize only the a-Si film without influencing the glass substrate, thereby obtaining a p-Si film functioning as an active semiconductor film.

Excimer lasers which emit high-output linear beams coping with a large area of the system-on panel have been developed. A p-Si film obtained by excimer laser crystallization is readily influenced by not only the irradiation energy density but also the beam profile, the state of the film surface, or the like. It is difficult to form uniformly a p-Si film large in crystal grain size in a large area. A sample crystallized by an excimer laser was observed with an AFM to find that crystal grains isotropically growing from nuclei produced at random exhibited a shape close to a regular polygonal shape, projections were observed at a crystal grain boundary at which crystal grains collided against each other, and the crystal grain size was less than 1 $\mu$m, as shown in FIG. 37.

In this manner, when a TFT is fabricated using a p-Si film obtained by crystallization using an excimer laser, a channel region contains many crystal grains. If the crystal grain size is large, and the number of grain boundaries present in the channel is small, the mobility is high. If the crystal grain size at a channel region portion is small, and the number of grain boundaries present in the channel is large, the mobility is low. Thus, the transistor characteristics of the TFT readily vary dependently on the grain size. In addition, the crystal grain boundaries have many defects, and the presence of the grain boundaries in the channel suppresses transistor characteristics. The mobility of the TFT attained by All this technique is about 150 $cm^2/Vs$.

SUMMARY OF THE INVENTION

It is an object of the present invention to provide semiconductor devices including TFTs in which the transistor characteristics of the TFTs are made uniform at a high level, and the mobility is high particularly in a peripheral circuit region to enable high-speed driving in applications to peripheral circuit-integrated TFT-LCDs, system-on panels, system-on glasses, and the like.

It is another object of the present invention to provide semiconductor devices in which the insufficiency of the output of an energy beam, which outputs energy continuously in relation to time, is compensated so that the throughput in crystallization of semiconductor films is improved, thereby realizing highly efficient TFTs whose mobility is high particularly in a peripheral circuit region to enable high-speed driving.

It is still another object of the present invention to provide manufacturing methods of such semiconductor devices.

It is still another object of the present invention to provide apparatus for manufacturing such semiconductor devices.

According to the first aspect of the present invention, there is provided a method of manufacturing a semiconductor device in which a pixel region having thin film transistors and a peripheral circuit region are formed on a non-crystallized substrate, comprising crystallizing a semiconductor film formed in the peripheral circuit region with an energy beam which outputs energy continuously along a time axis at least for the peripheral circuit region, thereby forming the semiconductor film into active semiconductor films of the respective thin film transistors.

In this case, the energy beam is preferably a CW laser beam, more preferably, a solid state laser beam (DPSS (Diode Pumped Solid State Laser) laser beam).

By crystallizing a semiconductor film with an energy beam which outputs energy continuously along the time axis, the crystal grain size is increased, e.g., the crystalline state of the semiconductor film is formed into a streamlined flow pattern having long crystal grains in the energy beam scan direction. The crystal grain size in this case is 10 to 100 times the size obtained by crystallization using a currently available excimer laser.

In the first aspect, each semiconductor film is preferably patterned into a linear or island shape on the non-crystallized substrate.

The crystallization technique using a CW laser has conventionally been studied in the SOI field, but a glass substrate has been considered not to resist heat. When a glass substrate is irradiated with a laser while an a-Si film is formed as a semiconductor film on the entire surface, the temperature of the glass substrate rises along with the temperature rise of the a-Si film, and damage such as cracks is observed. In the present invention, the semiconductor film is processed into a linear or island shape in advance to prevent the temperature rise of the glass substrate, generation of cracks, and diffusion of impurities into a film. Even in forming the active semiconductor film of a TFT on a non-crystallized substrate such as a glass substrate, an energy beam which outputs energy continuously along the time axis from a CW laser or the like can be used without any problem.

In the first aspect, an energy beam irradiation positioning marker corresponding to each patterned semiconductor film is formed on the non-crystallized substrate.

This marker can suppress an irradiation position shift of the energy beam. Supply of a stable continuous beam enables so-called lateral growth, and a semiconductor film having large-size crystal grains can be reliably formed.

In the first aspect, it is preferable that slits be formed in each semiconductor film patterned on the non-crystallized substrate, or thin-line insulating films be formed on each semiconductor film, and the semiconductor film be irradiated with the energy beam in an almost longitudinal direction of the slits.

In this case, the slits or insulating films (to be simply referred to as slits hereinafter for convenience) block crystal grains and grain boundaries which grow inward from the periphery in crystallization by irradiation of an energy beam. Only crystal grains which grow parallel to the slits are formed between the slits. If the region between the slits is satisfactorily narrow, single crystals are formed in this region. In this manner, the channel region can be selectively changed into a monocrystalline state by forming the slits so as to set a region where large-size crystal grains are to be formed, e.g., the region between the slits as the channel region of a semiconductor element, e.g., thin film transistor.

In the first aspect, it is preferable that an irradiation condition of the energy beam which outputs energy continuously along the time axis be changed between the pixel region and the peripheral circuit region, that a semiconductor film formed in the pixel region be crystallized with an energy beam which outputs energy pulses, and the semiconductor film formed in the peripheral circuit region be crystallized with the energy beam which outputs energy continuously along the time axis (more specifically, the semiconductor film formed in the pixel region be crystallized, and then the semiconductor film formed in the peripheral circuit region be crystallized), or that the semiconductor film formed in the peripheral circuit region be crystallized with the energy beam which outputs energy continuously along the time axis, the crystallized semiconductor film be set as an active semiconductor film, and a semiconductor film formed in the pixel region be set as an active semiconductor film without any change.

Although positional controllability is important for either of the pixel and peripheral regions, any thin film transistor formed in the peripheral circuit region requires higher performance than that in the pixel region, and must be optimized in fabrication. For this purpose, an energy beam which continuously outputs energy and can reliably form an active semiconductor film having large-size crystal grains and make the operation characteristics of respective thin film transistors uniform at high level is applied particularly to the peripheral circuit region. In the pixel region where the required performance is low, the energy beam irradiation time is shortened, or a pulse-like energy beam is applied. In this way, the crystallization process is changed between the peripheral circuit region and the pixel region. Accordingly, a desired system-on panel which very efficiently satisfies the required performance of respective locations can be implemented.

According to the second aspect of the present invention, there is provided a semiconductor device in which a pixel region having thin film transistors and a peripheral circuit region are formed on a non-crystallized substrate, wherein active semiconductor films of the respective thin film transistors constituting at least the peripheral circuit region are formed into a crystalline state of a streamlined flow pattern having large crystal grains.

In this case, the active semiconductor film can be changed into a large-crystal-grain state, and preferably a monocrystalline state along the streamlined shape of the flow pattern.

For example, the channel region of a thin film transistor can be changed into a monocrystalline state. A high-speed-driving thin film transistor excellent in transistor characteristics can be implemented.

Besides, the semiconductor film is preferably formed over the non-crystallized substrate with a buffer layer being interposed between them. The buffer layer includes a thin film containing Si and N, or Si, O, and N. The density of hydrogen in the semiconductor film is preferably $1 \times 10^{20}$/$cm^3$ or less, more preferably, the density of hydrogen in the buffer layer is $1 \times 10^{22}$/$cm^3$ or less.

By this construction, the transistor characteristics of the TFTs can be uniformized at a high level using crystallization with an energy beam that outputs energy continuously in relation to time. Further, the TFTs can stably be formed without generation of pinholes or peeling-off. Very highly reliable TFTs can be realized thereby.

According to the third aspect of the present invention, there is provided a semiconductor manufacturing apparatus for emitting an energy beam for crystallizing a semiconductor film formed on a non-crystallized substrate, wherein the semiconductor manufacturing apparatus can output the energy beam continuously along a time axis, and has a function of scanning the energy beam to an object to be irradiated, and output instability of the energy beam has a value smaller than ±1%.

In this case, the output instability of the energy beam is set to a value smaller than ±1%, and more preferably noise representing the instability of the energy beam with respect to the time is set to 0.1 rms % or less. A stable continuous beam can therefore be supplied. The continuous beam can be scanned to form uniformly the active semiconductor films of many thin film transistors in a large-size crystalline state (flow pattern).

According to the fourth aspect of the present invention, like the third aspect, there is provided a semiconductor manufacturing apparatus. The apparatus comprising disposing means for disposing a non-crystallized substrate on a surface of which a semiconductor film is formed, so that the non-crystallized substrate can freely be moved in a plane parallel with a surface of the semiconductor film, laser oscillation means that can output an energy beam continuous in relation to time, and beam splitting means for optically splitting the energy beam emitted from the laser oscillation means, into sub-beams. Each of the sub-beams is applied to relatively scan the corresponding portion of the semiconductor film to crystallize.

In this case, with the split sub-beams, the predetermined portions of the semiconductor film corresponding to the respective sub-beams can be crystallized at once. Thus, each of the active semiconductor films of many thin film transistors can be formed uniformly in a large-size crystalline state (flow pattern). Besides, even when using laser oscillation means whose output is lower than those of excimer lasers, such as a CW laser, a very high throughput not inferior to those in case of using excimer lasers can be obtained. Crystallization for thin film transistors can efficiently be achieved thereby.

In the fourth aspect, each sub-beam is preferably controlled so that only the portion where a thin film transistor is to be formed is irradiated with the beam at the optimum energy intensity for crystallization and the beam rapidly pass the portion where no thin film transistor is to be formed. A higher throughput can be obtained thereby, and very highly efficient crystallization for thin film transistors can be realized.

According to the fifth aspect of the present invention, like the third aspect, there is provided a semiconductor manufacturing apparatus. The apparatus comprising disposing means for disposing a non-crystallized substrate on a surface of which a semiconductor film is formed, so that the non-crystallized substrate can freely be moved in a plane parallel with a surface of the semiconductor film, laser oscillation means that can output an energy beam continuous in relation to time, and intermittent (pulse) emission means having a transmission area and an interruption area for the energy beam to intermittently transmit the energy beam. With moving the energy beam to relatively scan the non-crystallized substrate, the energy beam is intermittently applied to the semiconductor film to selectively crystallize only the portion where a thin film transistor is to be formed.

In this case, by controlling the transmission of the energy beam mainly with the intermittent emission means, only desired portions of the semiconductor film can be selectively crystallized. That is, only desired portions of the semiconductor film in the non-patterned state can be selectively crystallized. Therefore, it is needless to set up in advance the portions to be irradiated with the beam, i.e., the portions (ribbon-like or island-like) where thin film transistors are to be formed. As a result, the number of manufacturing steps can be reduced and the throughput can be improved.

In the fifth aspect, it is preferable that the energy beam is intermittently applied to certain portions other than where thin film transistors are to be formed, so as to form positioning markers for the thin film transistors each crystallized into a predetermined shape. By forming the positioning markers simultaneously with the crystallization of where thin film transistors are to be formed, the number of manufacturing steps can be reduced and efficient and accurate formation of the thin film transistors becomes possible.

The present invention includes semiconductor devices and manufacturing methods of the semiconductor devices, corresponding to the above fourth and fifth aspects.

BRIEF DESCRIPTION OF THE DRAWINGS

FIGS. 2A and 2B are a plan view and a photomicrographic view, respectively, showing the state of a semiconductor film patterned into a ribbon shape;

FIGS. 15A to 15D are schematic plan views showing the states of a semiconductor film in the second modification of the first embodiment;

FIGS. 16A to 16D are schematic views showing the states of a semiconductor film in the third modification of the first embodiment;

FIGS. 18A to 18C are schematic views showing the states of a semiconductor film in the fifth modification of the first embodiment;

FIG. 25 is a schematic view showing a state of selectively crystallizing a semiconductor film only at regions where TFTs are to be formed;

FIG. 27 is a schematic view showing the principal part of a DPSS laser device according to the fourth embodiment of the present invention;

DETAILED DESCRIPTION OF THE PREFERRED EMBODIMENTS

Preferred embodiments to which the present invention is applied will be described below in detail with reference to drawings.

(First Embodiment)

Crystallization by Energy Beam Output Continuously along Time Axis

The principal part of the first embodiment of the present invention, i.e., crystallization of a semiconductor film using an energy beam which outputs energy continuously along the time axis, e.g., a solid state laser (DPSS (Diode Pumped Solid State Laser) laser) of semiconductor excitation (LD excitation) will be disclosed.

An energy beam continuous along the time axis can irradiate and scan, e.g., an amorphous silicon (a-Si film) to form large-size polysilicon crystals. The crystal grain size at this time is about several $\mu$m, and very large crystals can be formed. This crystal grain size is 10 to 100 times the size obtained by using a currently available excimer laser. Hence, such crystals are very advantageous to TFTs at a peripheral circuit portion required to operate at high speed.

Figure 3A:
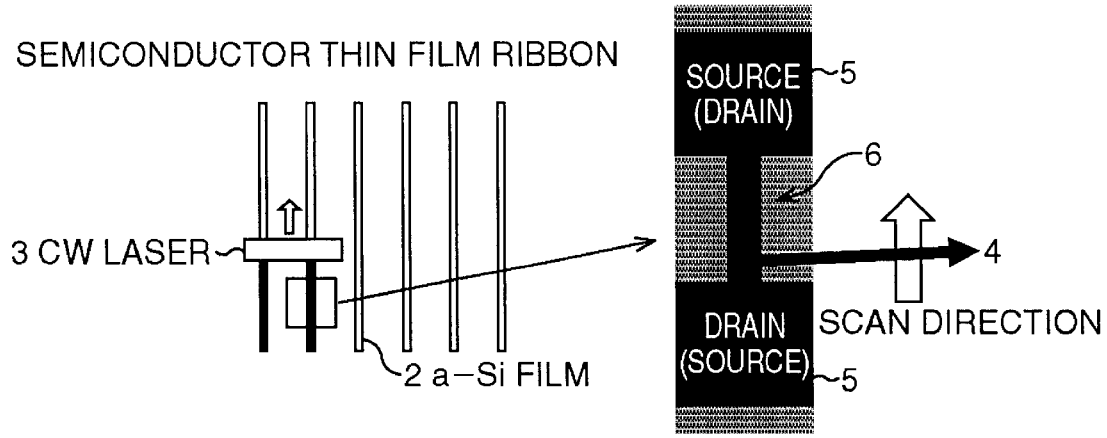
FIGS. 3A and 3B are photomicrographic views showing a state in which a TFT island is formed.
Figure 3B:
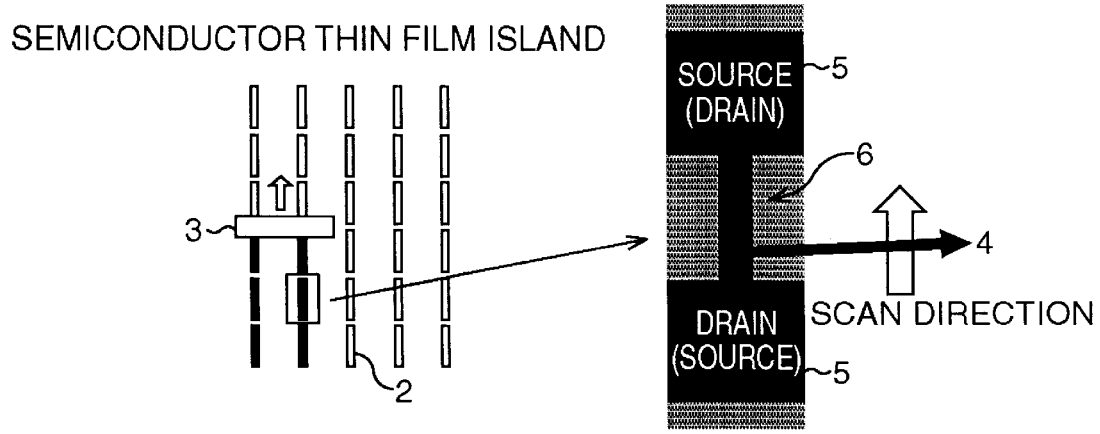

As shown in FIGS. 1A to 2B, an a-Si film 2 is patterned into a linear (ribbon) shape (FIG. 1A) or an island shape (FIG. 1B) on a glass substrate 1 having an SiO$_2$ buffer formed thereon. The upper surface of the a-Si film 2 or the lower surface of the glass substrate 1 is irradiated and scanned with an energy beam 3 output continuously along the time axis from a CW laser in a direction indicated by an arrow. After this, as shown in FIGS. 3A and 3B, each ribbon-shaped semiconductor film 2 (FIG. 3A) or each island-shaped semiconductor film 2 (FIG. 3B) is patterned and etched to form a TFT island region 6 having source and drain regions 5 via a channel region 4 in the semiconductor film 2.

Microcrystals are formed around the island region 6 because the cooling rate is high due to thermal diffusion to the peripheral region. However, the cooling rate in the island region 6 can be set sufficiently low by properly selecting the irradiation conditions (energy and scan speed) of the CW laser 3, and crystal grains several $\mu$m in width and several ten $\mu$m in length are formed. Thus, the crystal grain size of the channel portion can be increased.

The crystallization technique using an energy beam continuous along the time axis has conventionally been studied in the SOI (Silicon On Insulator) field, but a glass substrate has been considered not to resist heat. When a glass substrate is irradiated with a laser while an a-Si film is formed on the entire surface, the temperature of the glass substrate rises along with the temperature rise of the a-Si film, and damage such as cracks is observed. To solve this, the a-Si film is processed into a ribbon or island shape in advance to prevent the temperature rise of the glass substrate, generation of cracks, and diffusion of impurities into the film.

To form many TFTs in a large area, the energy beam must be stable. A solid state laser of semiconductor LD excitation has a stability of 0.1 rms % noise or less and an energy stability of <±1%/h, and is superior to other energy beams.

An example of crystallization using a diode pumped solid state laser (DPSS laser) with semiconductor excitation (LD excitation) will be described below.

The wavelength of the solid state laser is 532 nm (the second harmonic of Nd:YVO$_4$, the second harmonic of Nd:YAG, or the like). The energy beam output stability is <0.1 rms % noise, and the output time stability is <±1%/h. Note that the wavelength is not limited to this, and any wavelength capable of crystallizing a semiconductor film may be used. The output is 10 W, and NA35 glass is used as a non-crystallized substrate. The material of the non-crystallized substrate is not limited to this, and may be another non-alkali glass, silica glass, single-crystal silicon with amorphous insulating layer, ceramics, plastic, or the like.

An SiO$_2$ buffer layer is formed at a film thickness of about 400 nm between a glass substrate and a semiconductor film. Note that the buffer layer is not limited to this, and may be a layered structure of an SiO$_2$ film and SiN film. The go semiconductor film is a silicon thin film formed by plasma CVD. Heat treatment for dehydrogenation is done at 450° for 2 h before energy irradiation. Dehydrogenation is not limited to heat treatment, and may be achieved by emitting an energy beam many times while gradually increasing the energy level from a low energy side. In this embodiment, the semiconductor film is irradiated from the lower surface via the glass, but is not limited to this. The semiconductor film may be irradiated from the semiconductor film side.

The energy beam is shaped into an elongated linear beam (rectangular beam) 400 $\mu$m×40 $\mu$m in size. The size and shape of the energy beam are not limited to them, and the energy beam may be adjusted to an optimal size necessary for crystallization. As the shape of the beam, a rectangular (or elliptic) beam, a linear (or elliptic) beam, or the like, can be suitably used. Although it is preferable that such a long linear (or elliptic) beam, rectangular (or elliptic) beam, or linear (or elliptic) beam has uniform distribution of energy intensity in the beam, it is not always required. Such a beam may have an energy profile in which the maximum intensity is at the center of the beam.

In this embodiment, as shown in FIGS. 2A and 2B, the a-Si film 2 is patterned into a ribbon shape in the silicon region where a TFT is formed. Adjacent ribbon-shaped a-Si films 2 are separated by a predetermined distance, and a region where no a-Si film 2 exists is present. This layout of the a-Si films 2 can greatly reduce thermal damage to the NA35 glass substrate 1. Note that the a-Si film is not limited to the ribbon shape, but may be patterned into an island shape.

Figure 4:
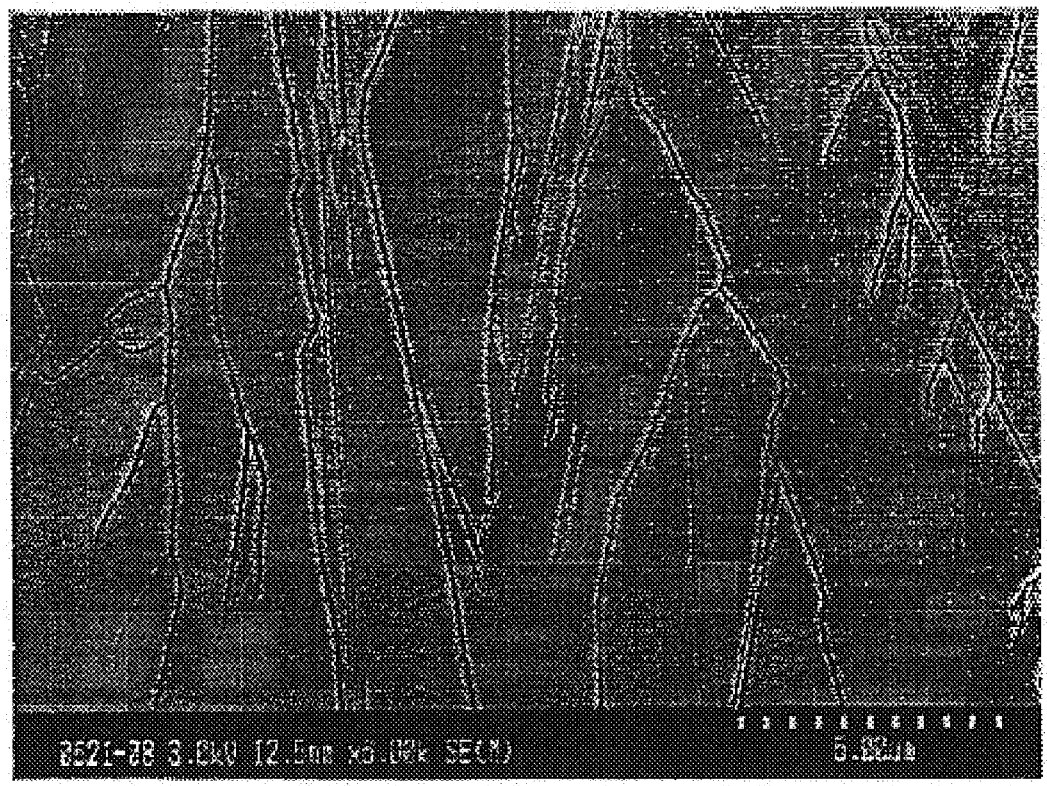
FIG. 4 is a SEM view showing the state of a semiconductor film crystallized by a CW laser (flow pattern)

FIG. 4 shows the results of crystallizing an a-Si film at an energy beam scan speed of 20 cm/s.

Figure 5:
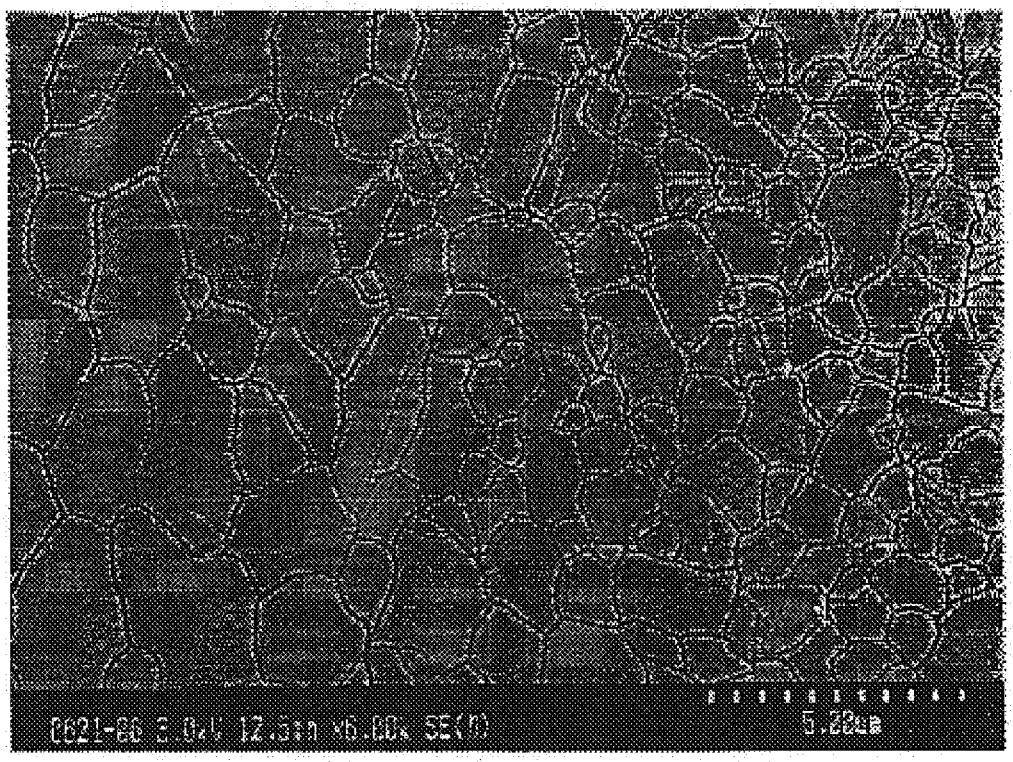
FIG. 5 is a SEM view showing the state of a semiconductor film crystallized into an excimer pattern by a CW laser.
Figure 37:
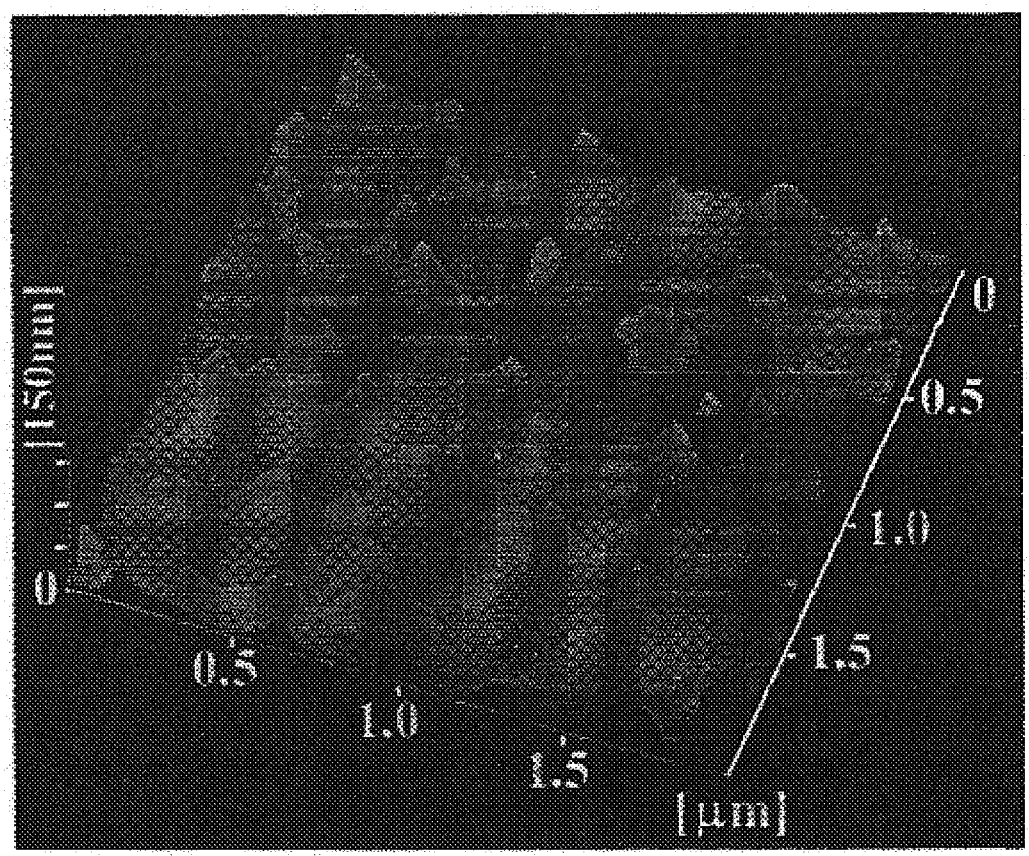
FIG. 37 is an AFM view showing a state of a silicon film crystallized using a conventional excimer laser.

Crystals 5 $\mu$m or more in crystal grain size are found to be formed. This crystal grain size corresponds to a size 10 to 100 times the grain size of crystallization by an excimer laser. Crystal grains as if they flow in a scan direction are observed, and this crystal pattern is defined as a "flow pattern" in this embodiment. The name is not limited to this, and is defined for descriptive convenience in this embodiment. As a crystal grain size different from that of the flow pattern, a pattern as shown in FIG. 5 similar to a crystallization pattern by an excimer laser in FIG. 37 is sometimes formed. This crystal grain pattern is defined as an "excimer pattern" in this embodiment. The excimer pattern is formed due to an improper energy density or scan speed (or both of them).

The results of observing the influence of a large amount of impurities present in glass on a crystallized film will be described.

In this embodiment, the $SiO_2$ film about 400 nm in film thickness formed by PECVD is interposed between the NA35 glass substrate 1 and the a-Si film 2 serving as a semiconductor film. The buffer layer is not limited to this, and may be 200 nm or more in film thickness for single $SiO_2$ or may use a layered structure of $SiO_2$ film and SiN film.

Figure 6:
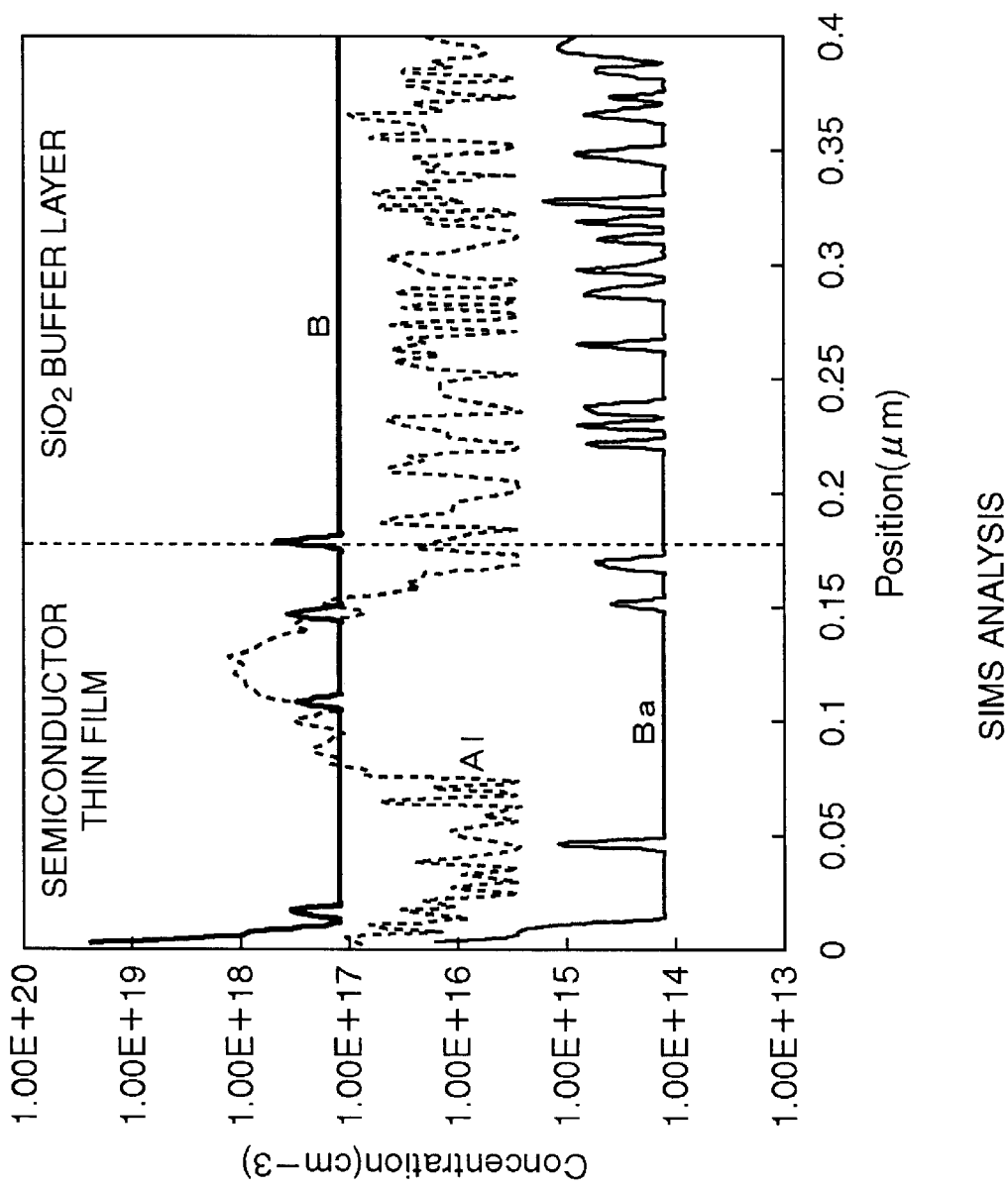
FIG. 6 is a graph showing SIMS analysis around a semiconductor film.

FIG. 6 shows the results of SIMS analysis.

It is confirmed that impurities (aluminum, boron, sodium, and barium) in glass do not exist in a crystallized semiconductor thin film. Aluminum is observed in data, but is a ghost. Aluminum does not actually exist in the film. The density of sodium is lower than detection limit.

Figure 7:
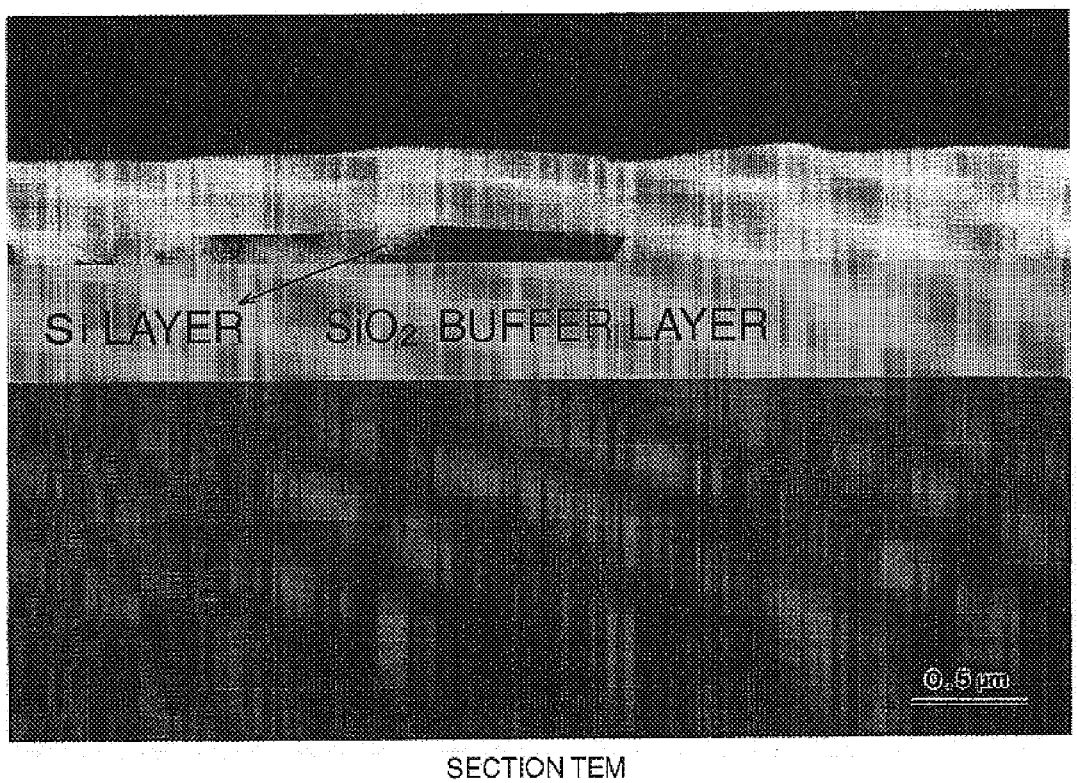
FIG. 7 is a photographic view showing sectional TEM around a semiconductor film.

FIG. 7 shows the results of inspecting thermal damage to NA35 glass (results of observing sectional TEM).

As shown in FIG. 7, the interface between the glass and the buffer layer is definite, and no damage to the glass can be confirmed.

In this embodiment, crystallization is achieved using one DPSS laser having an output of 10 W and a wavelength of 532 nm. When the layout of a semiconductor thin film pattern is already known, as shown in FIGS. 2A and 2B, it is possible to form plural beams and simultaneously emit them while matching them with semiconductor thin film regions. At this time, plural energy beam generators may be used, or an energy beam from one generator may be split into beams.

Fabrication of TFT

An example of fabrication of an n-channel thin film transistor using the above-described energy beam output continuously along the time axis will be explained. FIGS. 8A to 11C are schematic sectional views, respectively, showing the steps in manufacturing the thin film transistor.

Figure 8A:
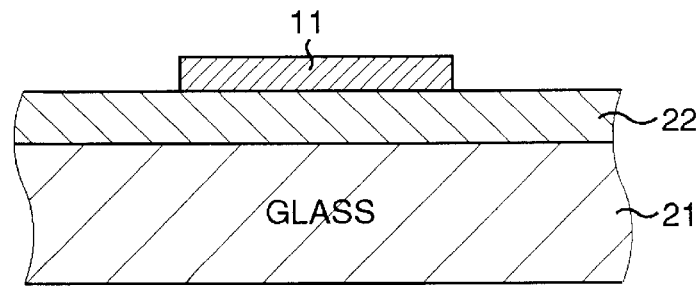
FIGS. 8A to 8C are schematic sectional views, respectively, showing the steps in manufacturing a TFT according to the first embodiment.

As a non-crystallized substrate, an NA35 glass substrate 21 is used similarly to the above example. As shown in FIG. 8A, an $SiO_2$ buffer layer 22 about 400 nm in film thickness, and a patterning Si thin film having a non-crystallized silicon thin film are formed on the glass substrate 21. Heat treatment is done at 450° for 2 h for the sake of dehydrogenation. Dehydrogenation is not limited to heat treatment, and may be achieved by emitting an energy beam many times while gradually increasing the energy level from a low energy side.

Then, the a-Si film 2 is crystallized using the above-mentioned energy beam output continuously along the time axis, thereby forming an active semiconductor film 11.

More specifically, as shown in, e.g., FIG. 2A, a semiconductor film, in this case the a-Si film 2 is formed in a ribbon shape. A DPSS laser is used with a wavelength of 532 nm, an energy beam stability of <0.1 rms % noise and an output stability of ±1%/h. The a-Si film 2 is crystallized by irradiating and scanning it by a linear beam 400 μm×40 μm in energy beam size at a scan speed of 20 cm/s.

Subsequently, as shown in, e.g., FIG. 3A, a TFT island region 6 is formed in the crystallized ribbon-shaped semiconductor film. At this time, the semiconductor film is so processed as to position a TFT channel region 4 on the central axis of the ribbon-shaped semiconductor film. That is, a current flowing in a completed TFT coincides with the laser beam scan direction. In this case, as shown in the lower part of FIG. 2A, a plurality (three in the illustrated example) of TFTs may be formed in each ribbon width.

Figure 8B:
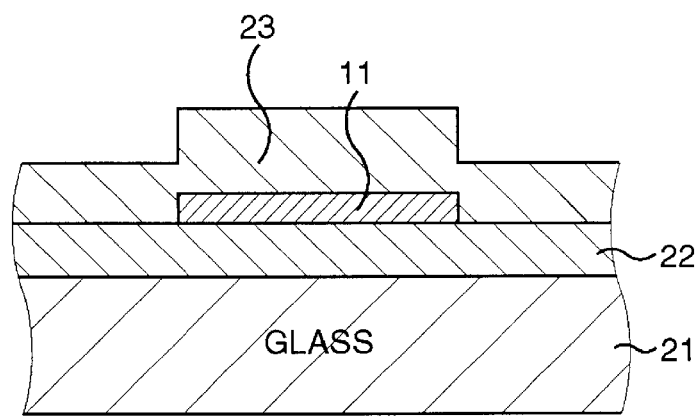

As shown in FIG. 8B, a silicon oxide film 23 serving as a gate oxide film is formed to a film thickness of about 200 nm on the active semiconductor film 11 by PECVD. The silicon oxide film 23 may be formed by another method such as LPCVD or sputtering.

Figure 8C:
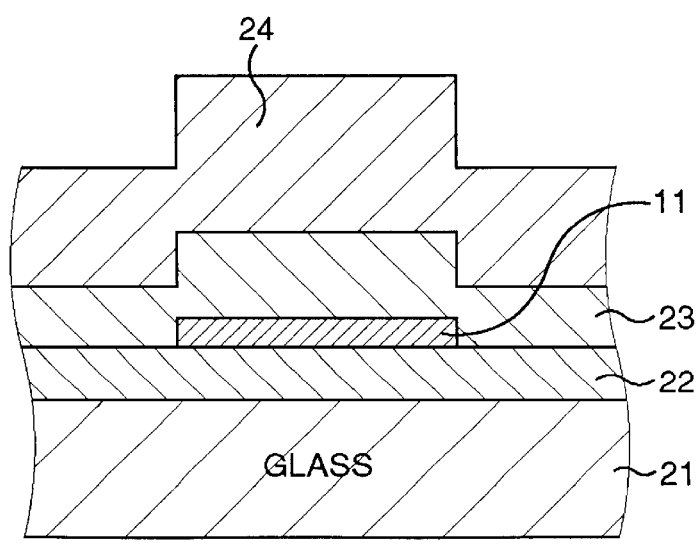

As shown in FIG. 8C, an aluminum film (or aluminum alloy film) 24 is sputtered to a film thickness of about 300 nm.

Figure 9A:
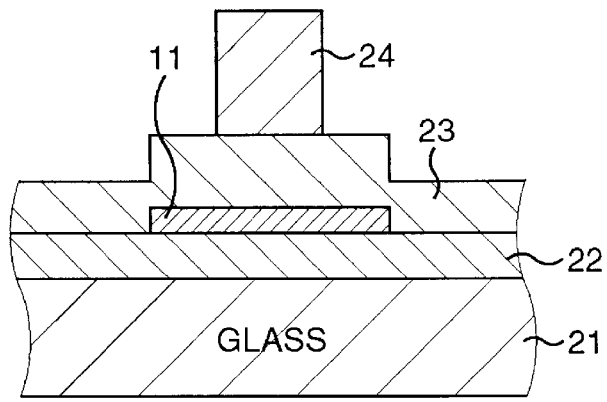
FIGS. 9A to 9C are schematic sectional views, respectively, showing the steps subsequent to FIG. 8C in manufacturing a TFT according to the first embodiment.

As shown in FIG. 9A, the aluminum film 24 is patterned into an electrode shape by photolithography and dry etching, thereby forming a gate electrode 24.

Figure 9B:
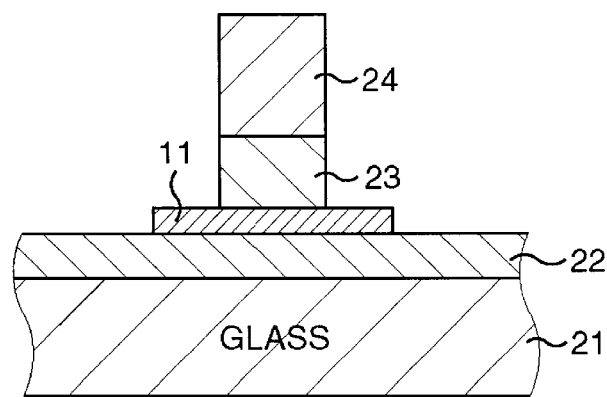

As shown in FIG. 9B, the silicon oxide film 23 is patterned using the patterned gate electrode 24 as a mask, thereby forming a gate oxide film 23 conforming to the gate electrode shape.

Figure 9C:
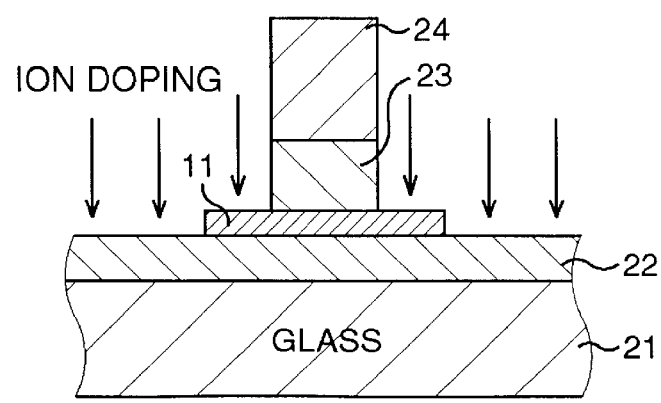

As shown in FIG. 9C, ions are implanted in the two sides of the gate electrode 24 of the active semiconductor film 11 using the gate electrode 24 as a mask. More specifically, n-type impurities, in this case phosphorus (P) are ion-implanted at an acceleration energy of 20 keV and a dose of $4 \times 10^{15}/cm^2$, thereby forming source and drain regions.

Figure 10A:
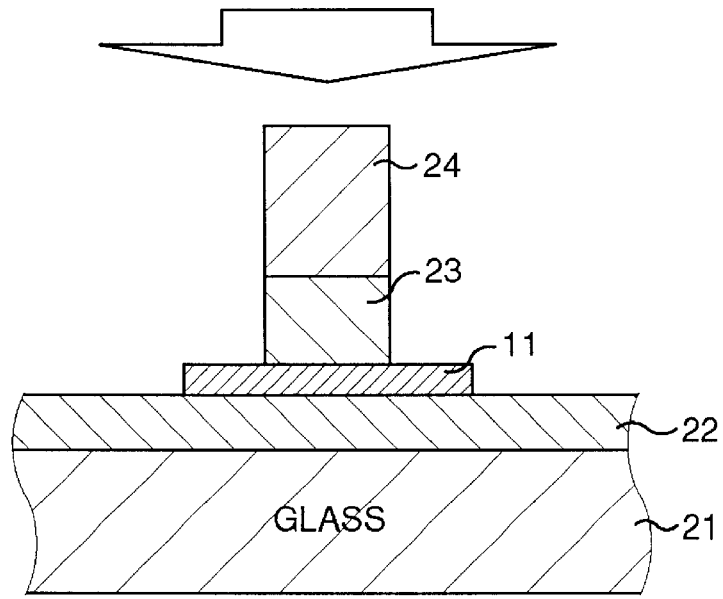
FIGS. 10A and 10B are schematic sectional views, respectively, showing the steps subsequent to FIG. 9C in manufacturing a TFT according to the first embodiment.
Figure 10B:
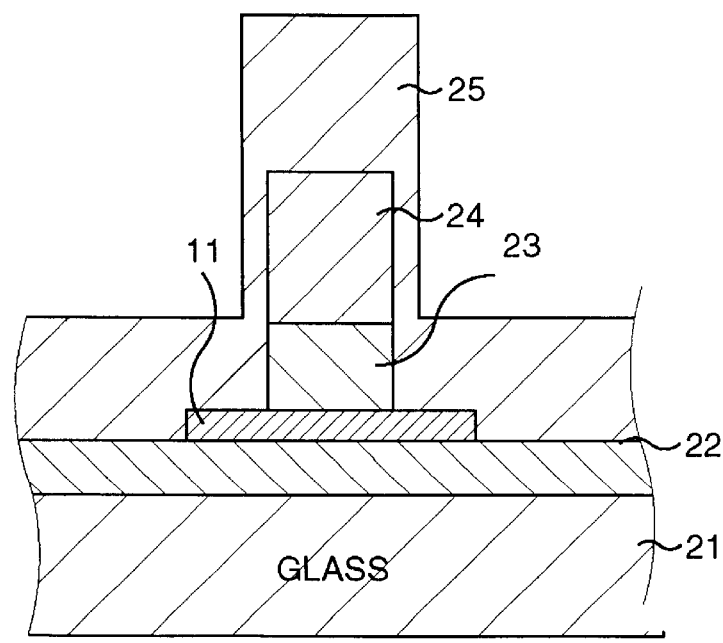

As shown in FIG. 10A, the resultant structure is irradiated with an excimer laser in order to activate phosphorous in the source and drain regions. Then, as shown in FIG. 10B, SiN is deposited to a film thickness of about 300 nm so as to cover the entire surface, thereby forming an interlevel insulating film 25.

Figure 11A:
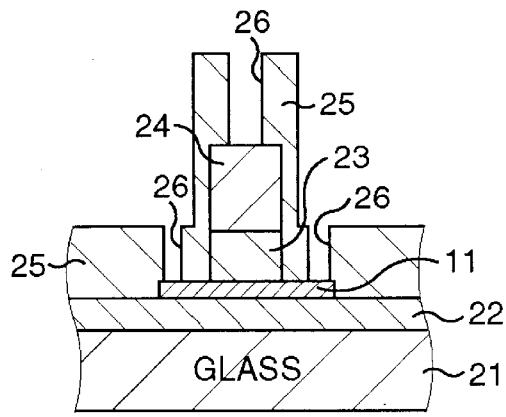
FIGS. 11A to 11C are schematic sectional views, respectively, showing the steps subsequent to FIG. 10B in manufacturing a TFT according to the first embodiment.

As shown in FIG. 11A, contact holes 26 for exposing the gate electrode 24 and the source and drain regions of the active semiconductor film 11 are formed in the interlevel insulating film 25.

Figure 11B:
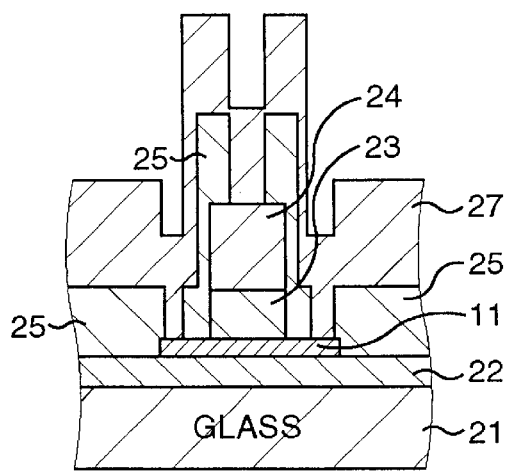
Figure 11C:
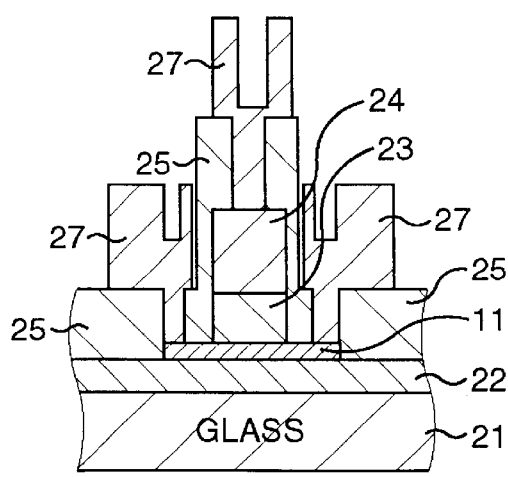

As shown in FIG. 11B, metal films 27 of aluminum or the like are formed to bury the contact holes 26. As shown in FIG. 11C, the metal films 27 are patterned to form wiring lines 27 which connect the gate electrode 24 and the source and drain regions of the active semiconductor film 11 via the contact holes 26. After that, formation of a protection film which covers the entire surface, and the like are performed to complete the n-type TFT.

Figure 12:
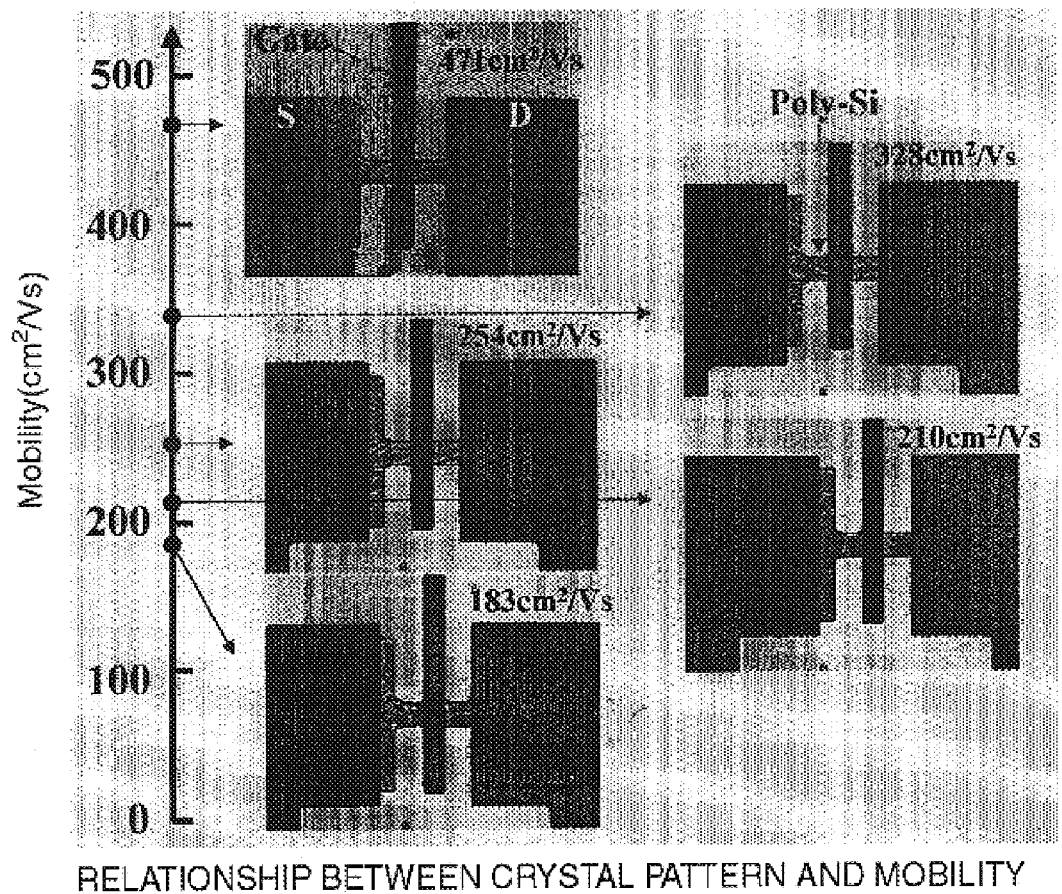
FIG. 12 is a graph showing the relationship between the crystal pattern and mobility of a semiconductor film.

The relationship between TFT characteristics and the crystal quality was checked using the n-channel TFT fabricated by the above steps. FIG. 12 shows experimental results.

Figure 13:
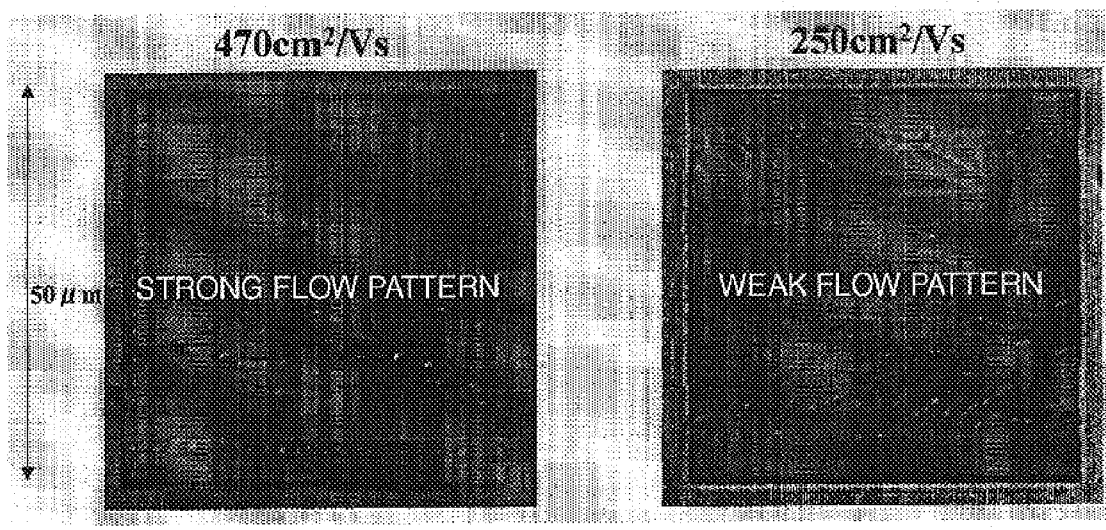
FIG. 13 is a photomicrographic view showing the relationship between the crystal pattern and mobility of the semiconductor film.

When the crystal pattern of the channel region is a flow pattern, the mobility is higher than that in an excimer laser pattern. The highest mobility is 470 $cm^2$/Vs. The mobility is strongly related to the flow pattern shape. As shown in FIG. 13, the mobility is confirmed to be higher in a strong flow pattern shape than in a weak flow pattern shape.

As described above, this embodiment can implement TFTs in which the transistor characteristics of the TFTs are made uniform at high level, and the mobility is high particularly in a peripheral circuit region to enable high-speed driving. This can implement a high-performance, peripheral circuit-integrated TFT-LCD, system-on panel, or system-on glass having many TFTs.

Modifications

Modifications of the first embodiment will be described.

(First Modification)

Figure 14:
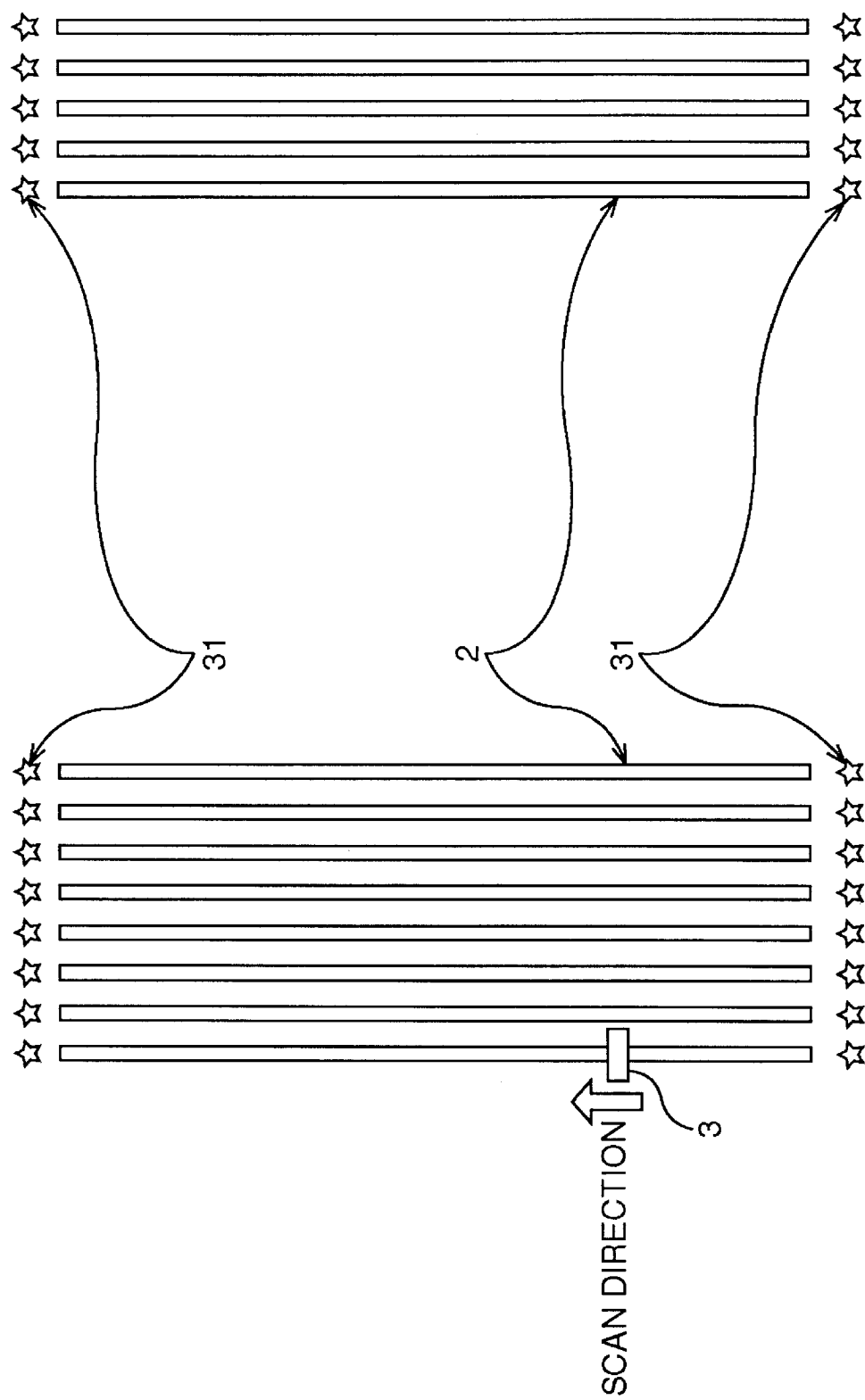
FIG. 14 is a schematic plan view showing ribbon-shaped semiconductor films and position markers in the first modification of the first embodiment.

FIG. 14 is a schematic plan view showing a state on a glass substrate in the first modification.

In this modification, the ribbon-shaped a-Si films 2 are formed as semiconductor films on the glass substrate 1, and a position marker 31 is set at an end portion of the glass substrate 1 corresponding to each a-Si film 2. Although the a-Si films are ribbon-shaped in the illustrated example, they may alternatively be island-shaped.

In irradiating and scanning the a-Si film 2 with an energy beam from the CW laser 3, the irradiation position can be automatically searched with reference to the position marker 31. After the irradiation position is determined, the energy beam is scanned to perform crystallization.

This modification can suppress a shift in the irradiation position of the energy beam. Supply of a stable continuous beam enables so-called lateral growth, and an active semiconductor film having large-size crystal grains can be reliably formed.

(Second Modification)

FIGS. 15A to 15D are schematic plan views for explaining the second modification.

As shown in FIG. 15A, the a-Si film is processed into an island shape having two almost parallel slits 32 and an island region is formed.

The upper surface of the a-Si film is irradiated with a CW laser, e.g., Nd:YVO$_4$ laser (2ω, wavelength of 532 nm) in the direction of the slit 32 (indicated by an arrow) at an energy of 6 W, a beam size of 400 μm×40 μm, and a scan speed of 20 cm/s. Even irradiation from the upper surface can normally crystallize the a-Si film. If the a-Si film is irradiated from the lower surface, the sample holder is also heated to obtain a heat-insulating effect on the film surface side and easily obtain higher-quality crystals. The a-Si film is fused and crystallized. The cooling rate is high around the island region 6 owing to thermal diffusion to the peripheral region, so that microcrystals are formed. In the channel region 4, the cooling rate can be set sufficiently low by properly selecting the irradiation conditions (energy and scan speed) of the CW laser, and crystal grains several μm in width and several ten μm in length are formed.

At this time, as shown in FIG. 15B, the slits 32 block crystal grains and grain boundaries which grow inward from the periphery and are to cross the channel region. Only crystal grains which grow parallel to the slits 32 are formed between the slits 32. If the interval between the slits 32 is satisfactorily small, this region is formed from single crystals. The slit width of each slit 32 is preferably formed as small as possible so as not to change the region between the slits 32 into microcrystals, while the slit 32 holding the grain boundary blocking effect. The interval between the slits 32 is set with a margin in accordance with the channel width of the device.

As shown in FIG. 15C, the resultant structure is patterned by dry etching so as to set the single-crystal portion between the slits 32 as the channel region 4, thereby completing the TFT.

As shown in FIG. 15D, a gate insulating film and gate electrode are formed by a known method. After impurities are implanted and activated, a source and drain are formed to fabricate the TFT.

By crystallization using this method, single crystals can be selectively obtained at a necessary portion of the channel region of the TFT. In a TFT formed using an active semiconductor film prepared in this way, only one crystal grain exists in the channel region. Thus, the characteristics are improved, and variations caused by crystallinity and the crystal grain boundary are greatly reduced. Further, various processes on a glass substrate can be performed, and a high-performance display with high value added at low cost can be provided.

(Third Modification)

FIGS. 16A to 16D are schematic plan views for explaining the third modification, and schematic sectional views taken along the line I–I'.

After the SiO$_2$ underlayer and a-Si film 2 are successively formed on the glass substrate 1, the a-Si film 2 is patterned into an island shape, as shown in FIG. 16A.

As shown in FIG. 16B, an SiO$_2$ film is formed to a film thickness of about 50 nm on the a-Si film 2 by CVD or the like, and processed into two parallel thin-line patterns 33.

As shown in FIG. 16C, the a-Si film 2 is irradiated and scanned with a CW laser from the upper surface. The irradiation conditions are the same as in the first embodiment. At this time, the a-Si film 2 is fused and crystallized again by laser heating. However, since the thin-line patterns 33 exist on the a-Si film 2, fused Si easily gathers by the surface tension, and Si thin lines 33a independent of the periphery are formed at the lower portions of the thin-line patterns 33. The Si thin lines block crystal grains and crystal grain boundaries which are to cross the channel. As a result, only crystal grains which grow parallel to the thin lines are formed between the two thin-line patterns 33.

The SiO$_2$ films of the thin-line patterns 33 are removed with an aqueous HF solution or the like. As shown in FIG. 16D, the resultant structure is processed by dry etching so as to set the single-crystal portion between the thin-line patterns 33 as the channel region 4. Thereafter, a gate insulating film and gate electrode are formed by a known method, thereby fabricating the TFT.

By crystallization using this method, single crystals can be selectively obtained at a necessary portion of the channel region of the TFT. In a TFT formed using an active semiconductor film prepared in this manner, only one crystal grain exists in the channel region. The characteristics are improved, and variations caused by crystallinity and the crystal grain boundary are greatly reduced. Moreover, various processes on a glass substrate can be performed, and a high-performance display with high value added at low cost can be provided.

(Fourth Modification)

Figure 17:
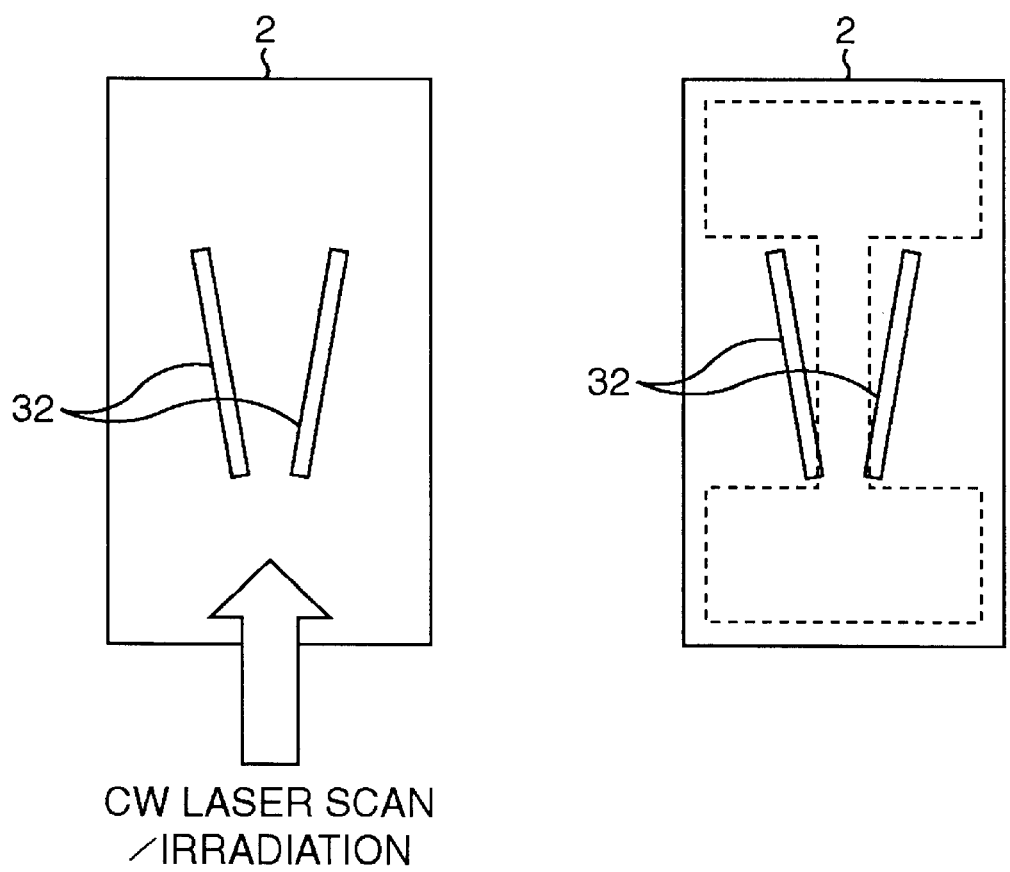
FIG. 17 is a schematic plan view showing the states of a semiconductor film in the fourth modification of the first embodiment.

The fourth modification is almost the same in the manufacturing process as the second modification except for the slit shape. FIG. 17 shows a slit shape in the fourth modification. Unlike the slit shape in FIGS. 15A to 15C, two slits 32 are not completely parallel, but are slightly widened in the laser scan direction. This shape can more efficiently block crystal grain boundaries diagonally inward from the periphery. In addition, crystal grains extending from the lower side in the drawing can be easily selected by the necking effect. The subsequent process is the same as in the second modification.

(Fifth Modification)

FIGS. 18A to 18C are schematic views for explaining the fifth modification. The upper portion of FIG. 18A is a plan view of a patterning portion, and the lower portion is a sectional view taken along the line I–I'. FIGS. 18B and 18C show manufacturing steps subsequent to FIG. 18A.

In an a-Si film 2, a thin film region 34 is surrounded by a thick-film region 35. Scanning and irradiation with a CW laser are executed in the longitudinal direction of the thin film region 34 (see FIG. 18A). At this time, the thick-film region 35 has a large heat capacity due to its thickness, and decreases in cooling rate during solidification. Hence, the thick-film region 35 has a hot bath effect on the thin film region 34. In the thin film region 34, the crystal grain boundary spreads toward the peripheral thick-film region 35 (see FIG. 18B). This means that the defect (crystal grain boundary) density decreases in the thin film region 34. That is, high-quality crystals can be implemented.

By using the thin film region 34 as the channel region of the TFT, a high-performance TFT can be implemented (see FIG. 18C).

(Second Embodiment)

The second embodiment of the present invention will be described below.

The construction of the DPSS laser device used in the first embodiment will be explained.

Figure 19:
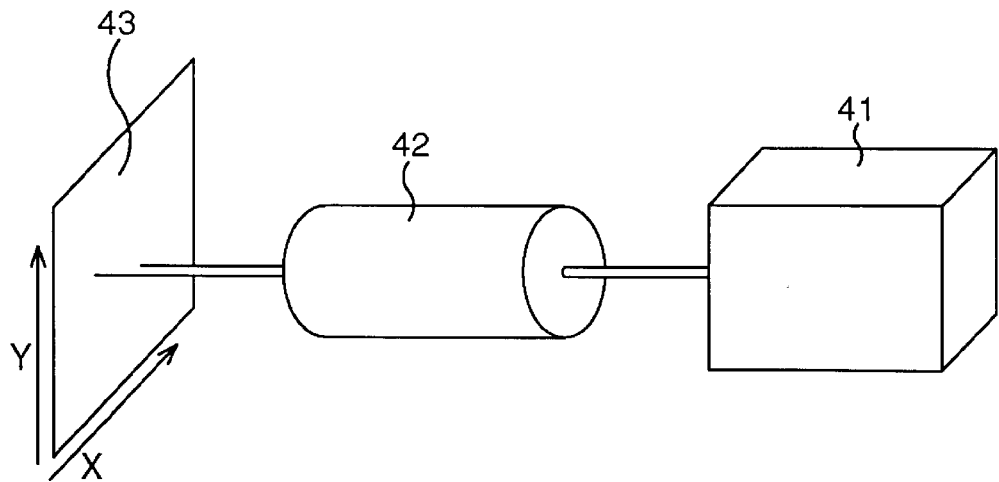
FIG. 19 is a schematic view showing a DPSS laser device in the second embodiment of the present invention.

FIG. 19 is a view showing the outer appearance of the whole construction of a DPSS laser device according to the second embodiment.

This DPSS laser device comprises a DPSS laser 41 of solid semiconductor LD excitation, an optical system 42 for irradiating a predetermined position with a laser beam emitted by the DPSS laser 41, and an X–Y stage 43 freely drivable in horizontal and vertical directions to which a glass substrate to be irradiated is fixed.

In the second embodiment, the glass substrate is made of NA35 glass (non-alkali glass), and the laser wavelength is 532 nm. Output variations in energy beam are noise of 0.1 rms % or less, the output instability is <±1%/h, and the output of the energy beam is 10 W. Note that the wavelength is not limited to this value, and any wavelength capable of crystallizing a silicon film may be used. Also, the beam output is not limited to this value, and a device having an appropriate output may be used.

The energy beam is shaped into a linear beam (rectangular beam) 400 μm×40 μm in size. The size and shape of the energy beam are not limited to them, and the energy beam may be adjusted to an optimal size necessary for crystallization. Energy variations in the longitudinal direction are within 40% using the center as the maximum intensity.

The glass substrate is set on the X–Y stage 43 to be perpendicular to the optical axis.

Figure 1A:
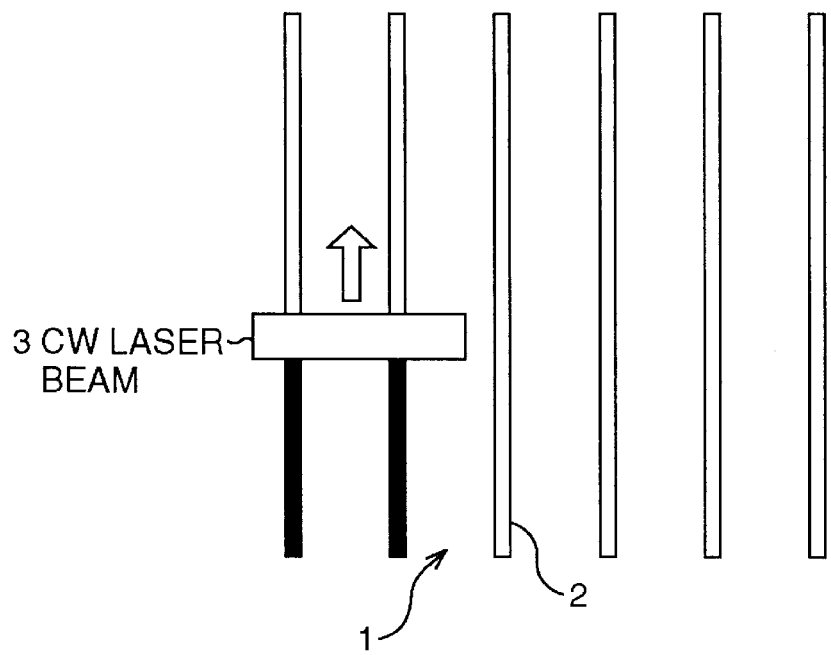
FIGS. 1A and 1B are schematic plan views showing the crystallizing state of a semiconductor film in the first embodiment of the present invention.
Figure 1B:
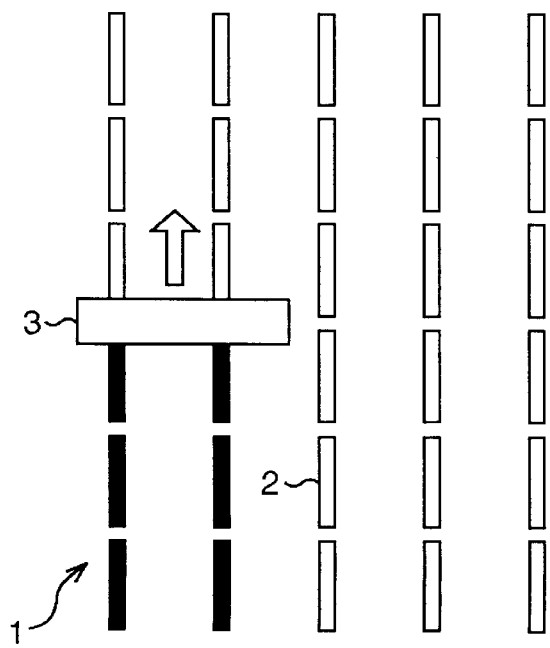

In the second embodiment, as well as the first embodiment, a semiconductor film (a-Si film) on which a TFT is to be fabricated is formed into a ribbon or island shape, as shown in FIG. 1A or 1B. Adjacent a-Si films are separated, and a region where no a-Si film exists is present. This reduces thermal damage to the glass substrate employed in this embodiment.

The energy beam scan speed is 20 cm/s. This embodiment adopts the motor-driven X–Y stage 43. Note that the driving mechanism of the X–Y stage 43 is not limited to this, and another stage can be used as far as it can be driven at a speed of 15 cm/s or more. Scanning with the energy beam can be performed by moving the energy beam relatively to the X–Y stage 43. That is, either the energy beam or the X–Y stage can be moved.

When polysilicon is to be formed on the glass substrate, positional control during scan is important because the current substrate size is 400 mm×500 mm. The X–Y stage 43 of this embodiment exhibits a positional variation of 10 μm or less every one-meter movement.

The DPSS laser device of this embodiment can supply a stable continuous beam by setting the energy beam output instability to a value smaller than ±1%, and preferably setting noise representing the energy beam instability with respect to the time to 0.1 rms % or less. By scanning this continuous beam, the active semiconductor films of many TFTs can be uniformly formed in a crystalline state (flow pattern) having a large grain size.

Modifications

Modifications of the second embodiment will be described below.

(First Modification)

Figure 20:
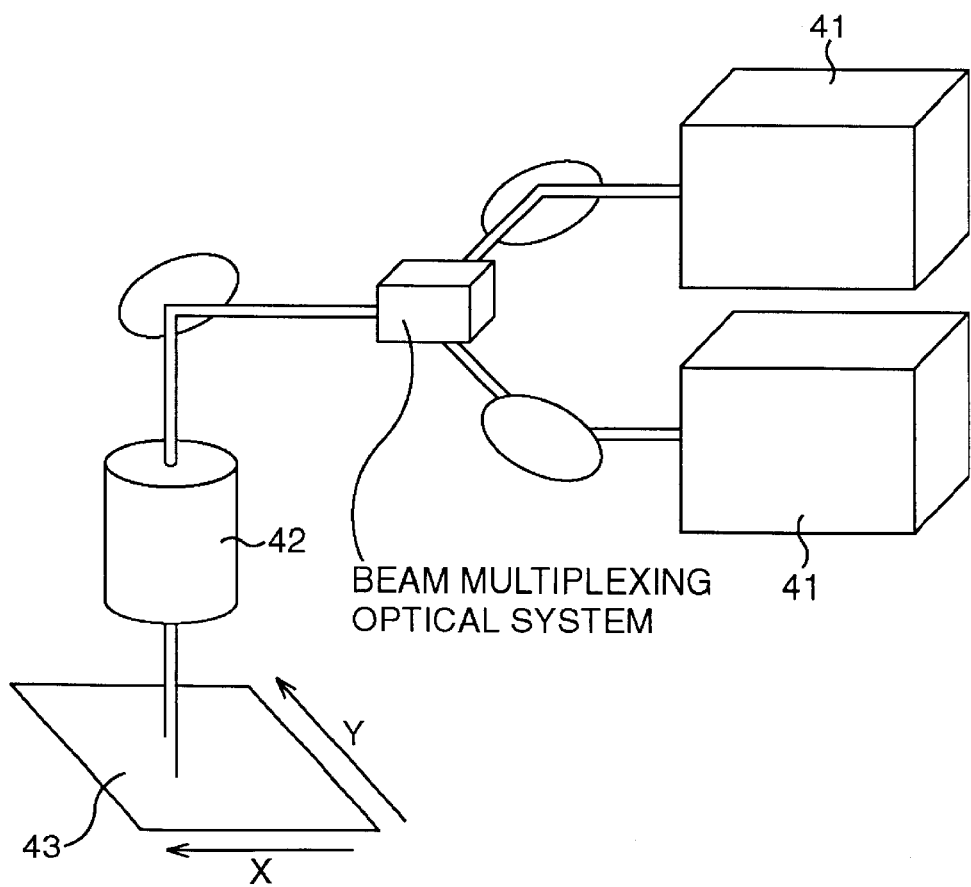
FIG. 20 is a schematic view showing a DPSS laser device in the first modification of the second embodiment.

FIG. 20 shows the whole construction of a DPSS laser device according to the first modification.

This modification uses the two DPSS lasers 41 having an output stability of 0.1 rms % noise or less, an output instability of <±1%/h, and an output of 10 W. Laser beams emitted by the two DPSS lasers 41 are multiplexed into one midway along the optical path, thereby improving the output.

The beam size is set to 800 μm×40 μm so as to irradiate a larger area than in the second embodiment. Similar to the first embodiment, this modification has a function of reading and irradiating a position marker.

The X–Y stage 43 is horizontally placed, and a glass substrate is horizontally set. A magnetic levitation type moving mechanism is disposed in the irradiation/scan direction, whereas a normal motor driving scheme is used in the X-axis direction. The energy beam is vertically emitted.

In addition to the effects of the second embodiment, the DPSS laser device of the first modification can supply a stabler continuous beam by providing DPSS lasers 41 (two in this case). By scanning this continuous beam, the active semiconductor films of many TFTs can be uniformly formed in a crystalline state (flow pattern) having a large grain size.

(Second Modification)

Figure 21:
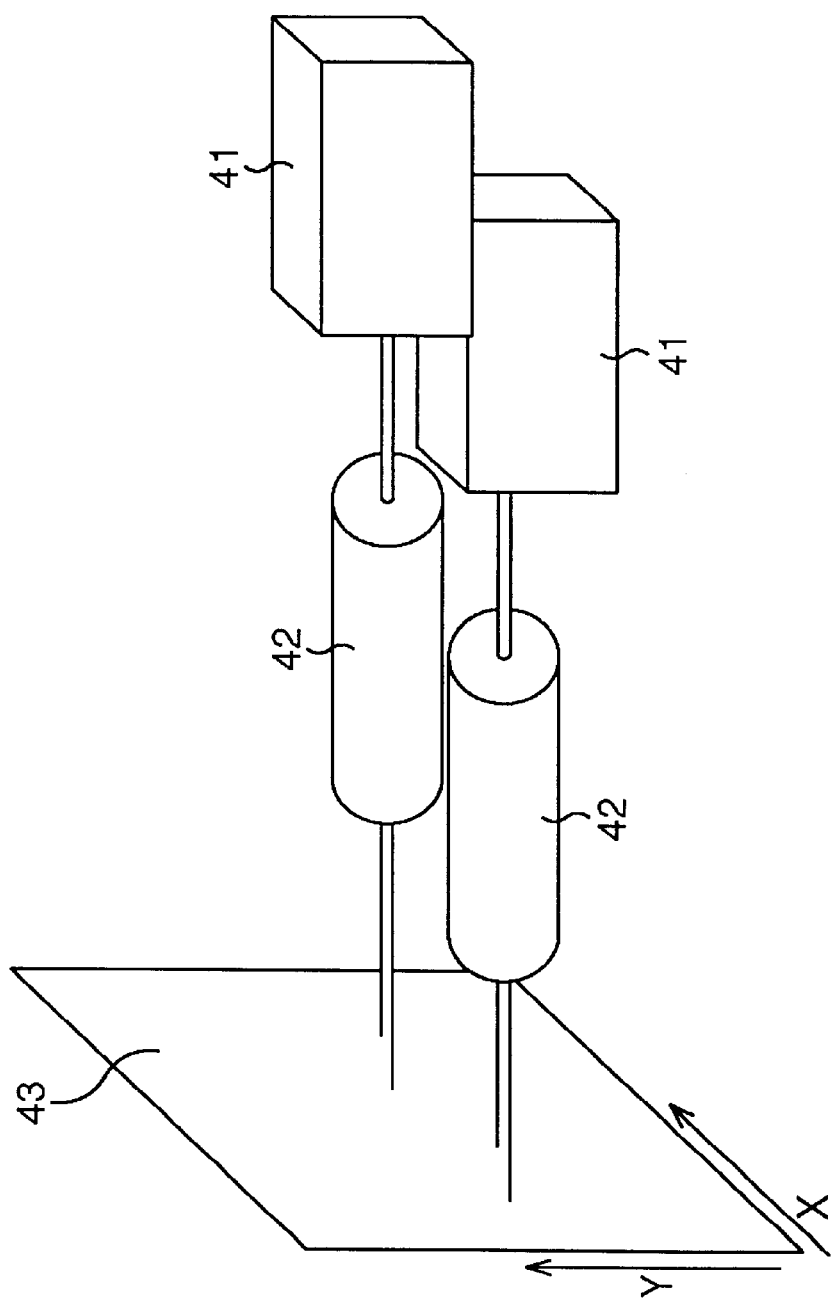
FIG. 21 is a schematic view showing a DPSS laser device in the second modification of the second embodiment.

FIG. 21 shows the whole construction of a DPSS laser device according to the second modification.

This modification adopts the two DPSS lasers 41 having the same output stability, output, and the like as in the first modification, and irradiates different locations. Each energy beam has a function of reading an irradiation position from a position marker.

In addition to the effects of the second embodiment, the DPSS laser device of the second modification can rapidly supply a stabler continuous beam by providing DPSS lasers 41 (two in this case). By scanning this continuous beam, the active semiconductor films of many TFTs can be uniformly formed in a crystalline state (flow pattern) having a large grain size.

(Third Embodiment)

Next, the third embodiment of the present invention will be described.

Here, like the second embodiment, the construction of a DPSS laser device and then a crystallization method of a semiconductor film using the DPSS laser device will be described. The DPSS laser device of this embodiment differs from that of the second embodiment on the point that the energy beam is split as described below.

In this embodiment described is an example of crystallization in the pixel region using a semiconductor exciting (LD exciting) solid state laser (DPSS laser) Nd:YVO$_4$. In this embodiment, a crystallization technique for the pixel region will be described, but the present invention is not limited to this. The present invention is applicable also to crystallization for any peripheral circuit. The laser is not limited to Nd:YVO$_4$. A similar DPSS laser light (e.g., Nd:YAG or the like) can be used also. The wavelength is 532 nm. The wavelength is not limited to this. Any wavelength can be used if it can melt silicon. The stability of the energy output is <0.1 rms % of noise, the stability of time of the output is <±1%/h, and the output is 10 W.

As the non-crystallized substrate used is an NA35 glass substrate. The non-crystallized substrate is not limited to this. Another non-alkali glass, quartz glass, monocrystalline substrate with amorphous insulating layer, ceramic, or plastic can be used.

An about 400 nm-thick buffer layer made of $SiO_2$ is formed between the glass substrate and a semiconductor film. The buffer layer is not limited to this. It can be a multilayer film of $SiO_2$ and SiN. The semiconductor film is an about 150 nm-thick silicon film formed through a plasma CVD process. Before irradiation with an energy beam, a thermal treatment for dehydrogenation has been performed at 500° C. for two hours. Dehydrogenation is not limited to such a thermal treatment. It can be implemented by many times of irradiation with an energy beam as the energy of the beam is gradually increased from the lower energy side. In this embodiment, the irradiation is done from the semiconductor film side, but it may be done from the back surface side through the glass.

Construction of DPSS Laser Device

Figure 22:
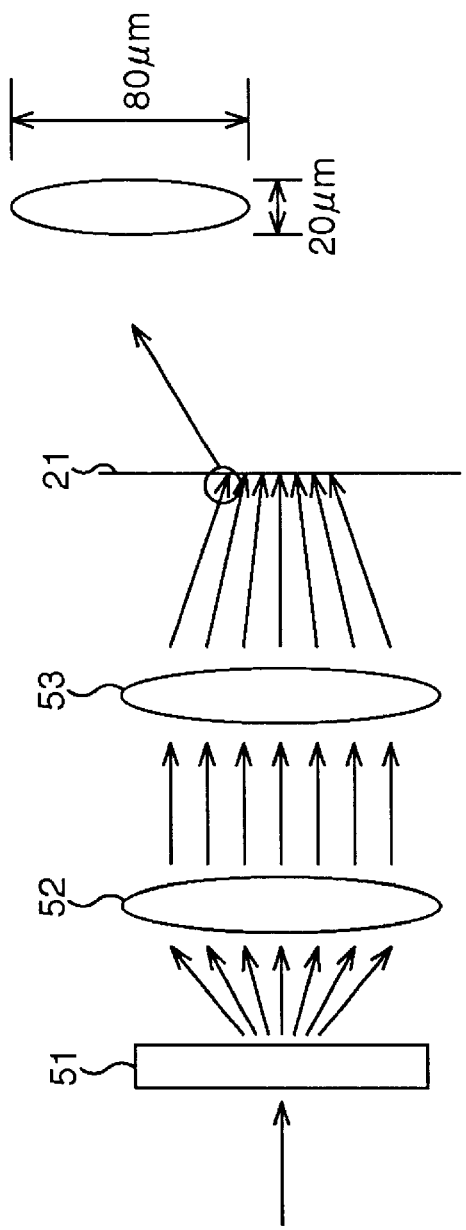
FIG. 22 is a schematic view showing part of a DPSS laser device according to the third embodiment of the present invention.

FIG. 22 is a schematic view showing part of a DPSS laser device according to this third embodiment.

The DPSS laser device includes a solid state semiconductor-exciting DPSS laser 41 (not shown) like the second embodiment, a diffraction grating 51 as beam splitting means for optically splitting an energy beam emitted from the DPSS laser 41, into a number of sub-beams, in the illustrated example, seven sub-beams, a collimator lens 52, a condenser lens 53 for condensing the split sub-beams, and an X–Y stage 43 (not shown), like the second embodiment, on which the glass substrate to be irradiated is mounted and which can freely be driven horizontally and vertically.

Although the diffraction grating 51 is used as the beam splitting means in this embodiment, the beam splitting means is not limited to this. For example, also usable is a polygon mirror, a movable mirror, an AO device (Acousto-Optic Device) using an acoustooptic effect, or an EO device (Electro-Optic Device) using an electrooptic effect.

Each sub-beam has a size of 80 $\mu$m×20 $\mu$m, which is sufficient for forming a thin film transistor in the pixel region. Each sub-beam has an elliptic beam shape in which the maximum intensity is at the centroid. The beam shape is not limited to such an elliptic beam shape. A long linear beam (or a rectangular beam) can be used also. The size of the energy beam is also not limited to the above. Any beam size can be used if it can form a pixel TFT.

Figure 23:
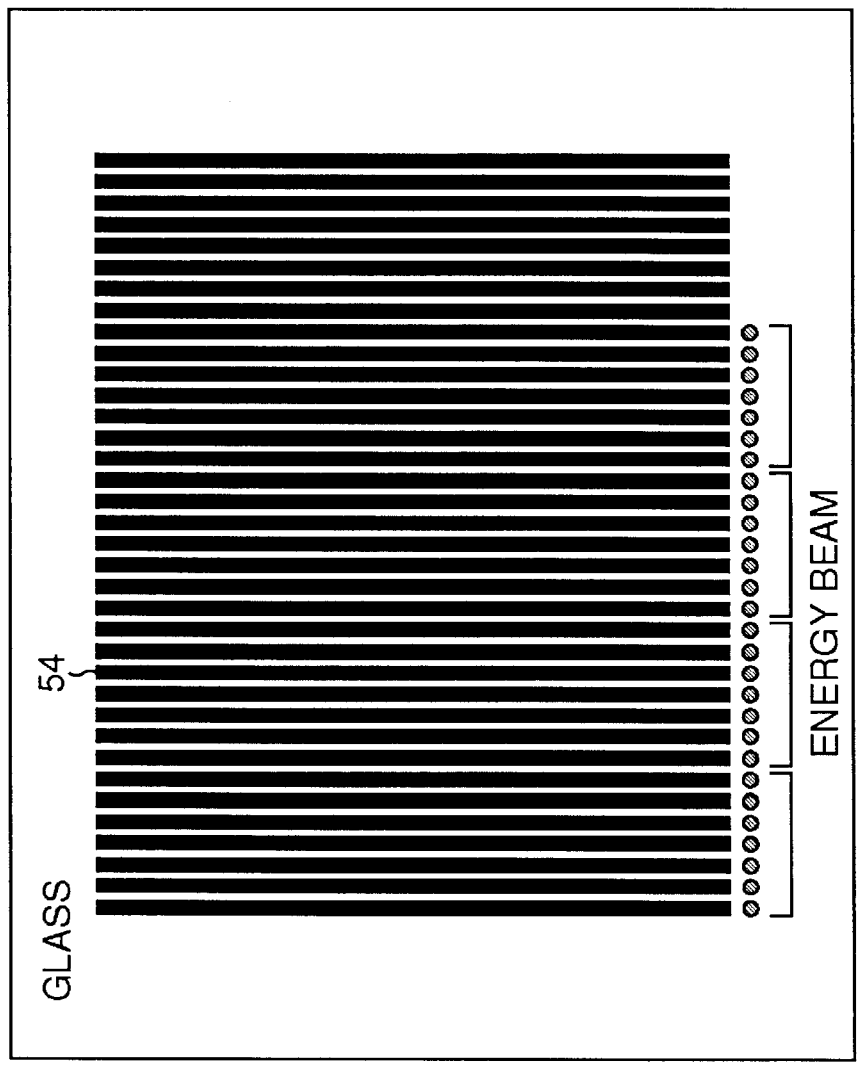
FIG. 23 is a schematic view showing a state that 28 sub-beams in total are generated using four DPSS lasers.

In this embodiment, each silicon region where a pixel TFT is to be formed is ribbon-shaped as shown in FIG. 23. Each semiconductor film ribbon 54 is separated from the neighboring semiconductor film ribbon 54 on either side, and there is interposed a region including no semiconductor film portion. This is for reducing thermal damage on the NA35 glass substrate used in this embodiment.

The pattern of the semiconductor film is not limited to such a ribbon shape. An island pattern can be used also. Since such a pixel TFT requires not so high performance, the beam energy density for crystallization can be reduced in comparison with the peripheral region. For this reason, even if the amorphous silicon were formed on the entire surface, crystallization can be performed without damaging the glass substrate.

FIG. 23 is a schematic view showing a state that 28 sub-beams in total are generated using four DPSS lasers.

In the crystallization technique for pixel TFTs in this embodiment, the scanning speed with the energy beam is 100 cm/sec. The scanning speed is not limited to this value. Any scanning speed can be used if it can implement the required performance of the pixel TFTs.

In order to irradiate the entire surface of the pixel region, the 28 sub-beams in the lump are moved in parallel to crystallize every 28 lines. The entire surface of the pixel region is thus crystallized with an improved throughput. In this embodiment, this operation is performed by rapidly moving the X–Y stage 43. But, the present invention is not limited to this manner. The 28 sub-beams can be moved in the lump while the X–Y stage 43 is fixed. The number of sub-beams is 28 in this embodiment. But, it is of course that the number of sub-beams is not limited to this value.

Figure 24A:
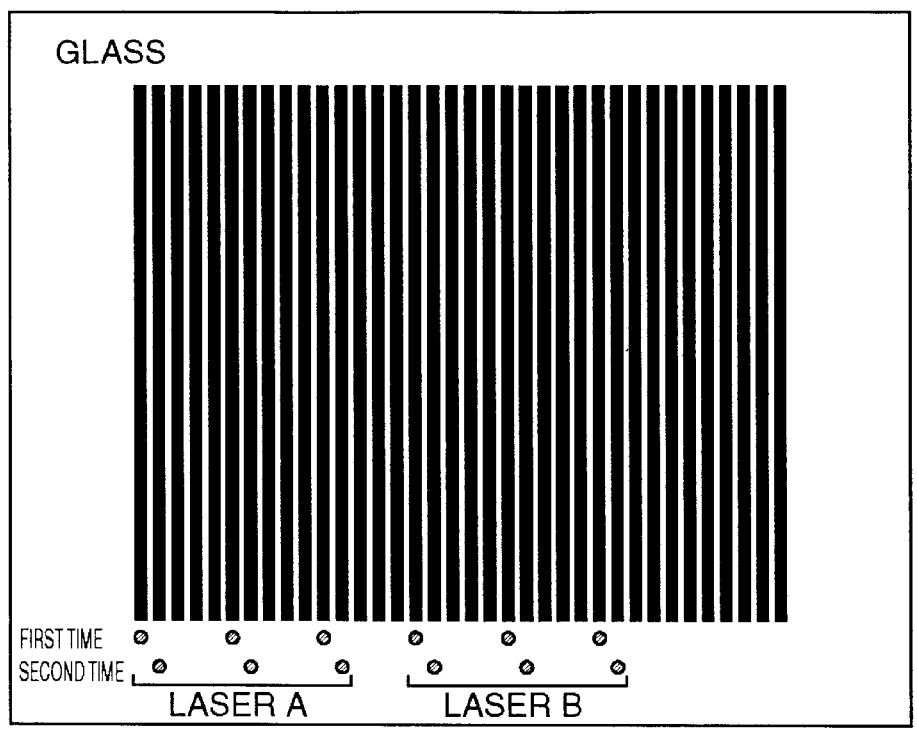
FIGS. 24A and 24B are a schematic view showing another irradiation method using the DPSS lasers.

The irradiation method with the beams is not limited to that in FIG. 23. An irradiation method as shown in FIG. 24A is also suitable. In this example, a plurality (two in the illustrated example) of lasers are each divided into a plurality (three in the illustrated example) of sub-beams. These sub-beams are moved to scan without overlapping each other. In this example, lateral movement in each scanning operation can be made shorter in distance.

Figure 24B:
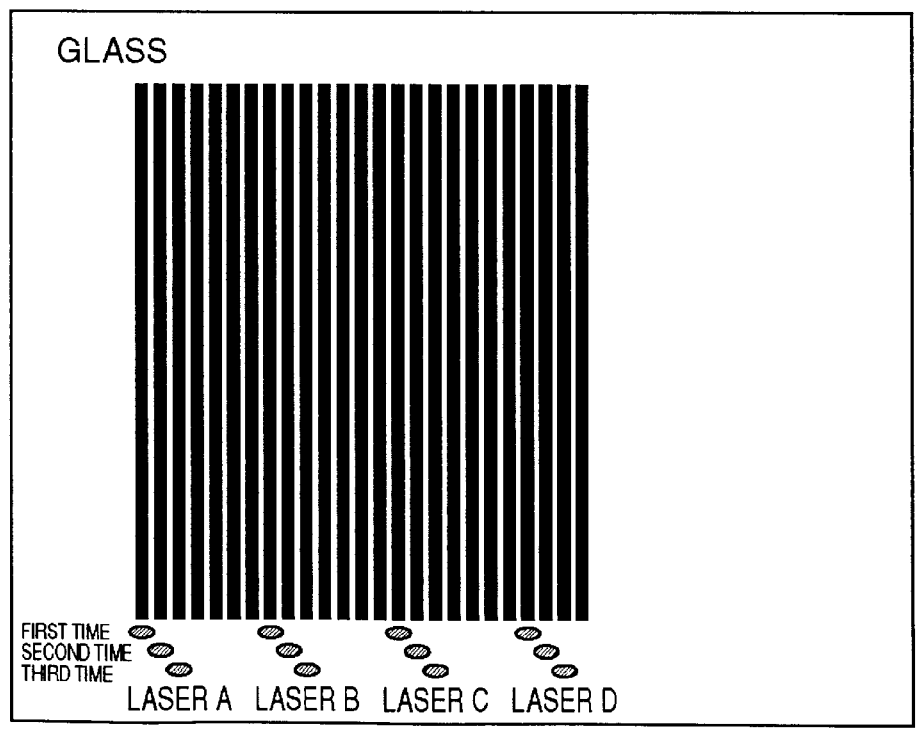

Further, for example, an irradiation method as shown in FIG. 24B can be suitably used also. In this example, each DPSS laser 41 emits one energy beam. The energy beams emitted from the respective DPSS lasers 41 are moved without overlapping each other. This irradiation method is effective particularly for peripheral circuits, which require crystallization by a higher energy. This irradiation method is, of course, usable for the pixel region.

As a result of observing crystal grains in each beam line formed by the method of FIG. 23, it was confirmed that polysilicon with its crystal grain size of 300 nm was formed.

Fabrication of TFT

TFTs were fabricated using, as the active semiconductor film, a semiconductor film crystallized with the DPSS laser device of this embodiment. The fabrication process of the TFTs was the same as that in the first embodiment described with reference to FIGS. 8 to 11.

In this embodiment, the semiconductor film to be crystallized was formed into a ribbon pattern in which 50 $\mu$m-wide ribbons were arranged at certain intervals so as to match the pixel layout. The wavelength was 532 nm. The output was 10 W. The stability of the energy beam was <0.1 rms % of noise. The stability of the output was <±1%/h. The shape of the energy beam was elliptic of 80 $\mu$m×20 $\mu$m. The scanning speed was 100 cm/sec. Crystallization was performed under the above conditions.

When the mobility of a TFT fabricated through the same process as that in the first embodiment described with reference to FIGS. 8 to 11 was examined, it was about 20 $cm^2$/Vs. This value shows a performance that can be sufficiently put in practical use as a pixel transistor.

Modifications

Modifications of this third embodiment will be described below.

Here will be described, as shown in FIG. 25, efficient crystallization methods for selectively crystallizing the semiconductor film only at the regions where TFTs are to be formed.

Figure 26A:
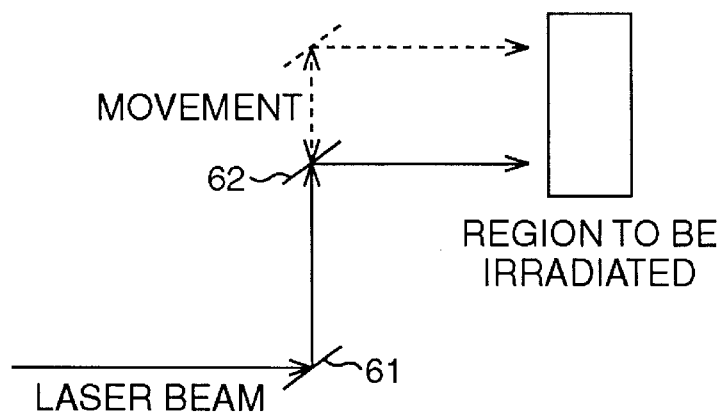
FIGS. 26A and 26B are schematic views showing irradiation systems of DPSS lasers used in modifications of the third embodiment.
Figure 26B:
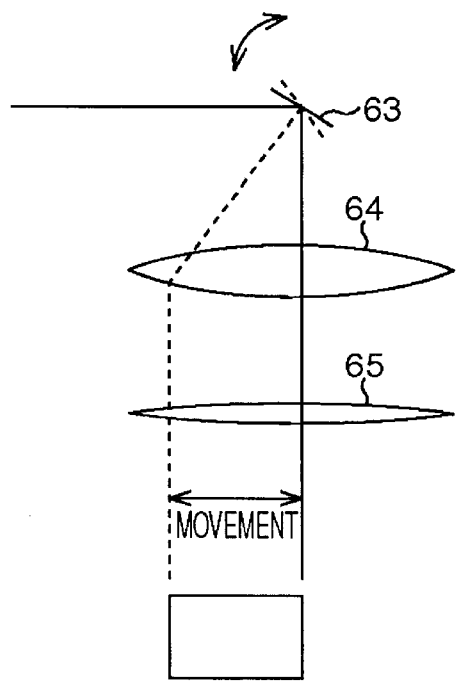

FIGS. 26A and 26B are schematic views of irradiation systems of DPSS laser devices used in modifications of this embodiment.

Referring to FIG. 26A, an irradiation system A is made up from a fixed mirror 61 for reflecting a sub-beam in a predetermined direction, and a movable mirror 62 for further reflecting the beam, which has been reflected by the fixed mirror 61, in a predetermined direction to irradiate the target region. Such an irradiation system A is provided for each of split sub-beams.

Referring to FIG. 26B, an irradiation system B is made up from a fixed mirror 63 for reflecting a sub-beam to a predetermined direction, a collimator lens 64, and a condenser lens 65 for condensing the beam, which has been reflected by the fixed mirror 63, through the collimator lens 64 to irradiate the target region. Such an irradiation system B is provided for each of split sub-beams.

In addition to moving the X–Y stage 43, the optical system shown in FIG. 26A or 26B is equipped for each of the split sub-beams. Either optical system is designed to scan only the region for forming each TFT. That is, the range of each sub-beam shifting is less than 100 μm at most.

While the X–Y stage 43 is rapidly moved, the optical system is turned on at each pixel position to crystallize the pixel portion. This brings about an improvement of the throughput.

In this embodiment, the amorphous silicon can be formed on the entire surface of the substrate, or into a ribbon or island pattern. In any case, it is of course that the portions to be irradiated with the laser beam must be match the layout of the pixel region.

(Fourth Embodiment)

Next, the fourth embodiment of the present invention will be described.

Here, like the second embodiment, the construction of a DPSS laser device and then a crystallization method of a semiconductor film using the DPSS laser device will be described. The DPSS laser device of this embodiment differs from that of the second embodiment on the point that the laser beam can be selectively applied to arbitrary portions as described below.

In this embodiment, the a-Si film is not processed in advance into an island pattern but it is left as in the non-patterned state. In this state, using an energy beam whose size is restricted to substantially correspond to the width of each island (about 100 μm or less), irradiation is intermittently carried out while the X–Y stage is moved. Thus obtained are crystallized regions (molten regions) equivalent to the respective islands in the first embodiment. In this manner, the problems of damaging the glass substrate and peeling off the film can be avoided.

In case of application to LCDs, while the peripheral circuit region is highly integrated and it requires TFTs with better crystallization and higher mobility, the pixel region includes the areas for the respective TFTs at relatively large intervals and each TFT requires not so high mobility. But, the occupied area by the pixel region is far greater than that by the peripheral circuit region. So, in the pixel region, the X–Y stage is moved at a high speed (about several m/s) and crystallization is discretely performed only at necessary portions, thereby considerably improving the throughput.

Construction of DPSS Laser Device

FIG. 27 is a schematic view showing the principal part of a DPSS laser device according to this fourth embodiment.

The DPSS laser device includes a solid state semiconductor LD exciting laser 41 like the second embodiment, an optical system 71 having the function of a collimator and the function of a condenser, a chopper 72 as intermittent emission means that is disposed in the optical path through which the energy beam reaches the a-Si film 70 on the glass substrate, has transmission (ON) areas 72a and interruption (OFF) areas 72b for the energy beam, and can be rotated in the arrow direction to allow the energy beam to intermittently pass through, a mirror 73 for reflecting the energy beam having passed through an ON area 72a, to the glass substrate, and an X–Y stage 43 (not shown), like the second embodiment, that can be freely driven horizontally and vertically. Using this DPSS laser device, a CW laser light, e.g., Nd:YAG laser light (2ω, the wavelength: 532 nm) is shaped into a beam size of 20 μm×5 μm through the optical system 72.

Figure 28:
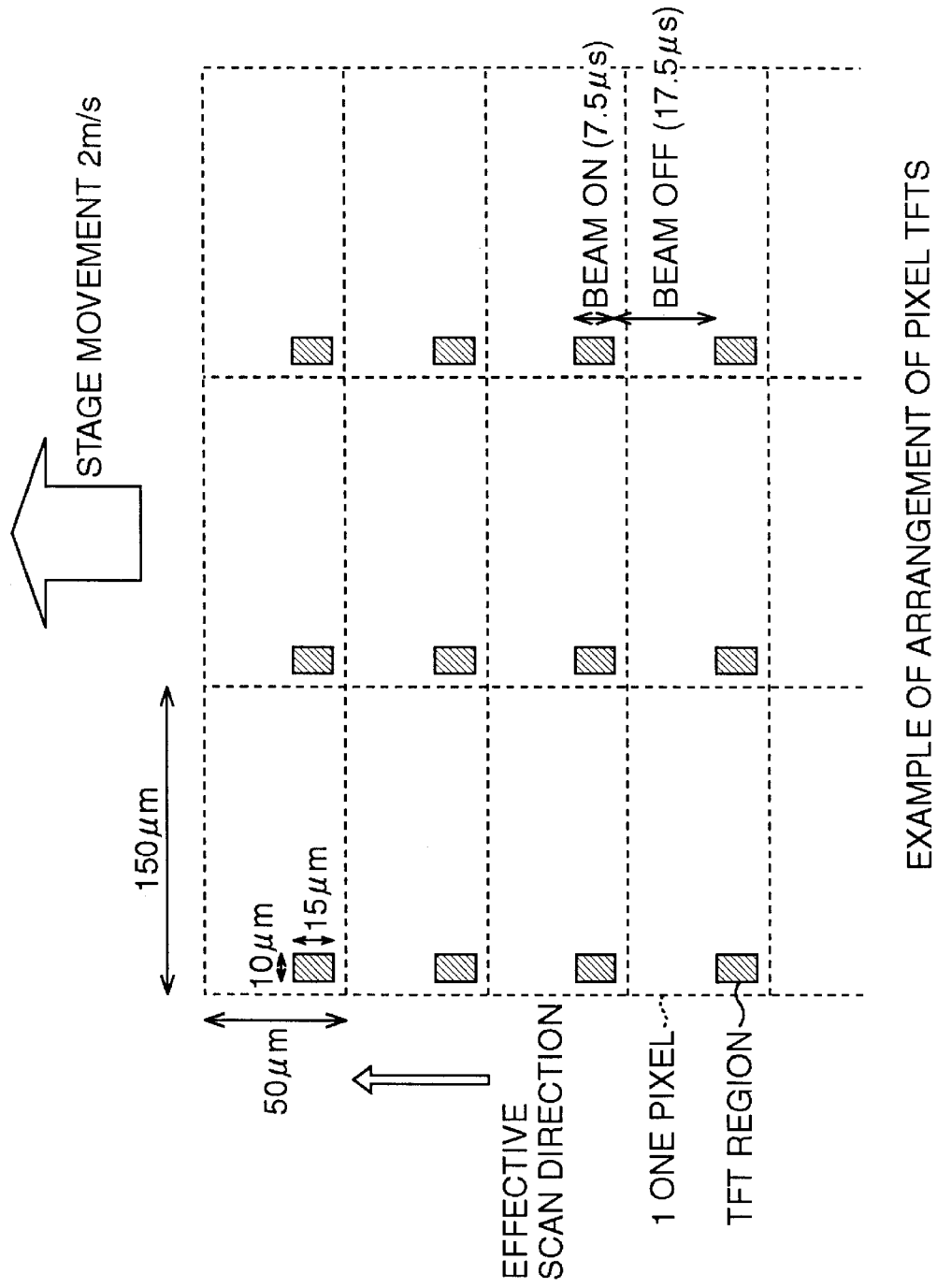
FIG. 28 is a schematic view showing an example of arrangement of TFTs in a pixel region.

In this case, it is efficient to scan in the arrow direction indicated in FIG. 28. This is effective even to intermittent irradiation as the case in FIG. 1, for example, not limited to intermittent irradiation with the energy beam.

FIG. 28 is a schematic view showing an example of arrangement of TFTs in the pixel region.

In this embodiment, each pixel size is 150 μm×50 μm and the TFT region may has a size of 10 μm×15 μm. After a $SiO_2$ buffer layer (thickness: 200 nm) and then an a-Si film (thickness: 150 nm) are formed on a glass substrate, the chopper 72 is rotated. The energy beam is thereby made ON/OFF at a rate of 7.5 μs/17.5 μs, and applied with a scanning speed (speed of the X–Y stage) of 2 m/sec. In this manner, without processing the a-Si film into an island pattern, without damaging the glass substrate and peeling off the film, only necessary portions of the a-Si film (e.g., crystallization regions 74 in FIG. 27) can be selectively crystallized.

Preferably in this case, the energy beam is intermittently applied to certain portions of the a-Si film other than where TFTs are to be formed, to crystallize and form positioning markers 75 (FIG. 27) having a predetermined shape, and these markers 75 (FIG. 27) are used as indexes upon crystallization of the a-Si film.

When crystallization of the a-Si film is performed by the above method, large-grain crystals can be obtained using the CW laser, and this does not bring about any increase in process steps and time. In a TFT formed with such a large-grain crystal, the characteristics is improved and unevenness due to crystal is reduced. Thus, a high-performance liquid crystal display device with values added can be provided with holding down the cost.

Modifications

Modifications of this fourth embodiment will be described below.

(Modification 1)

In this modification, a crystallizing method of the a-Si film for TFTs in the peripheral circuit region of a liquid crystal display device will be described.

In the peripheral circuit region, the degree of integration is higher than that in the pixel region, and requirement for crystallization is severe. As regions where TFTs are to be formed, crystallization regions each having a size of 50 μm×200 μm are formed at intervals of 5 μm. A circuit is formed in each of the crystallization regions. For this purpose, a CW laser is shaped into a beam size of 50 μm×5 μm through the optical system. After a $SiO_2$ buffer layer (thickness: 200 nm) and then an a-Si film (thickness: 150 nm) are formed on a glass substrate, the chopper 72 is rotated. The energy beam is thereby made ON/OFF at a rate of 1 ms/0.025 ms, and applied with a scanning speed (speed of the X–Y stage) of 20 cm/sec. By reducing the scanning speed to about 20 cm/sec, fluent long crystal grains (flow pattern) can be obtained, thereby forming a TFT with a high mobility. In this manner, without processing the a-Si film into an island pattern, without damaging the glass substrate and peeling off the film, high-quality crystals can be formed at necessary portions.

(Modification 2)

In this modification, the intermittent emission means for making the energy beam ON/OFF is implemented by a combination of a small hole and a mirror.

Figure 29:
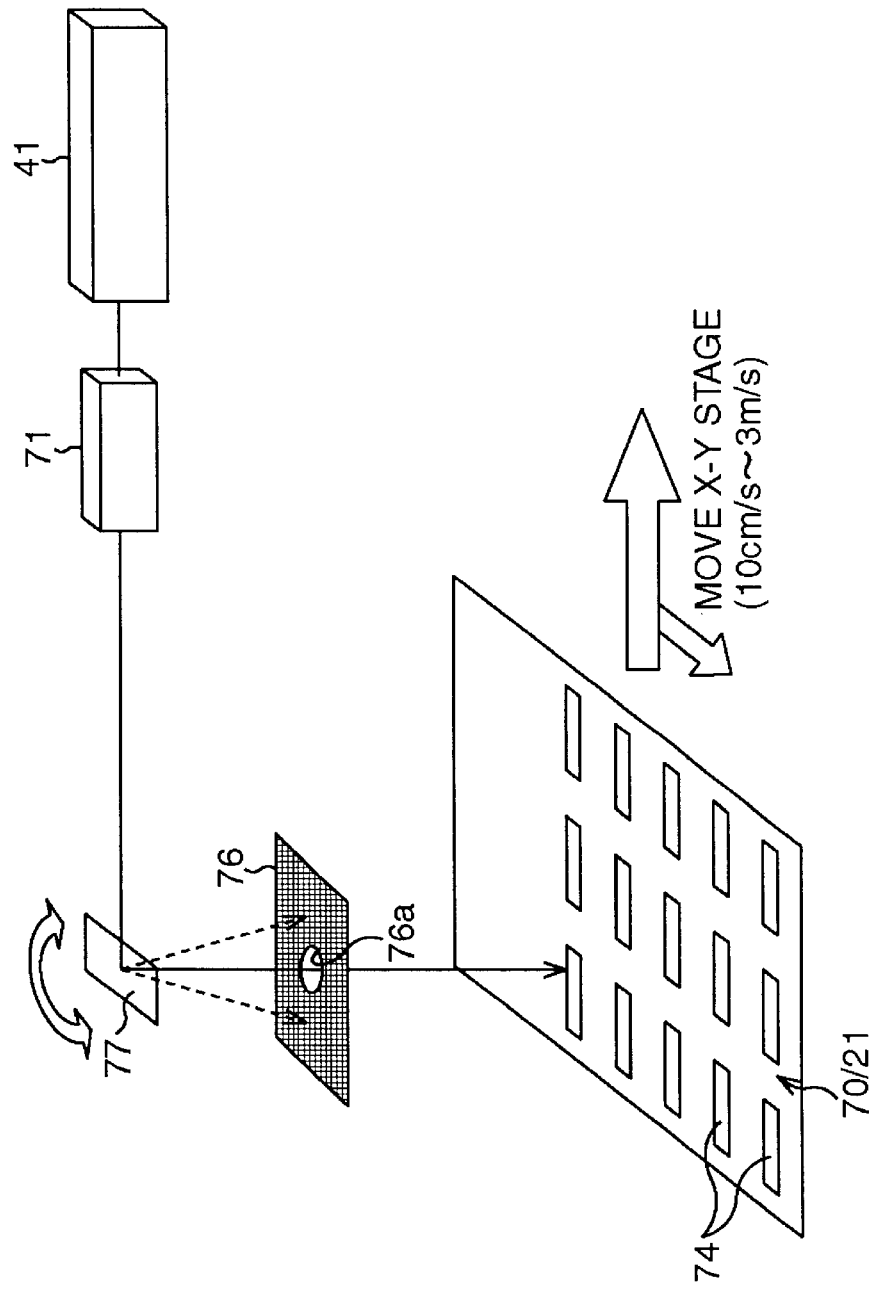
FIG. 29 is a schematic view showing the principal part of a DPSS laser device according to modification 2 of the fourth embodiment.

FIG. 29 is a schematic view showing the principal part of a DPSS laser device according to this modification 2.

In addition to the DPSS laser 41 and the optical system 71, the DPSS laser device includes a rotatable mirror for reflecting the energy beam in a desired direction, in place of the chopper 72. The DPSS laser device further includes an interruption board 76 having a small hole 76a for allowing only the energy beam in a desired direction to pass. In this modification, the mirror 77 is rotated to swing the energy beam. The energy beam is made ON only when it passes the hole 76a. As the means for swing the energy beam, a rotatable polygon mirror can also be used.

(Modification 3)

Figure 30:
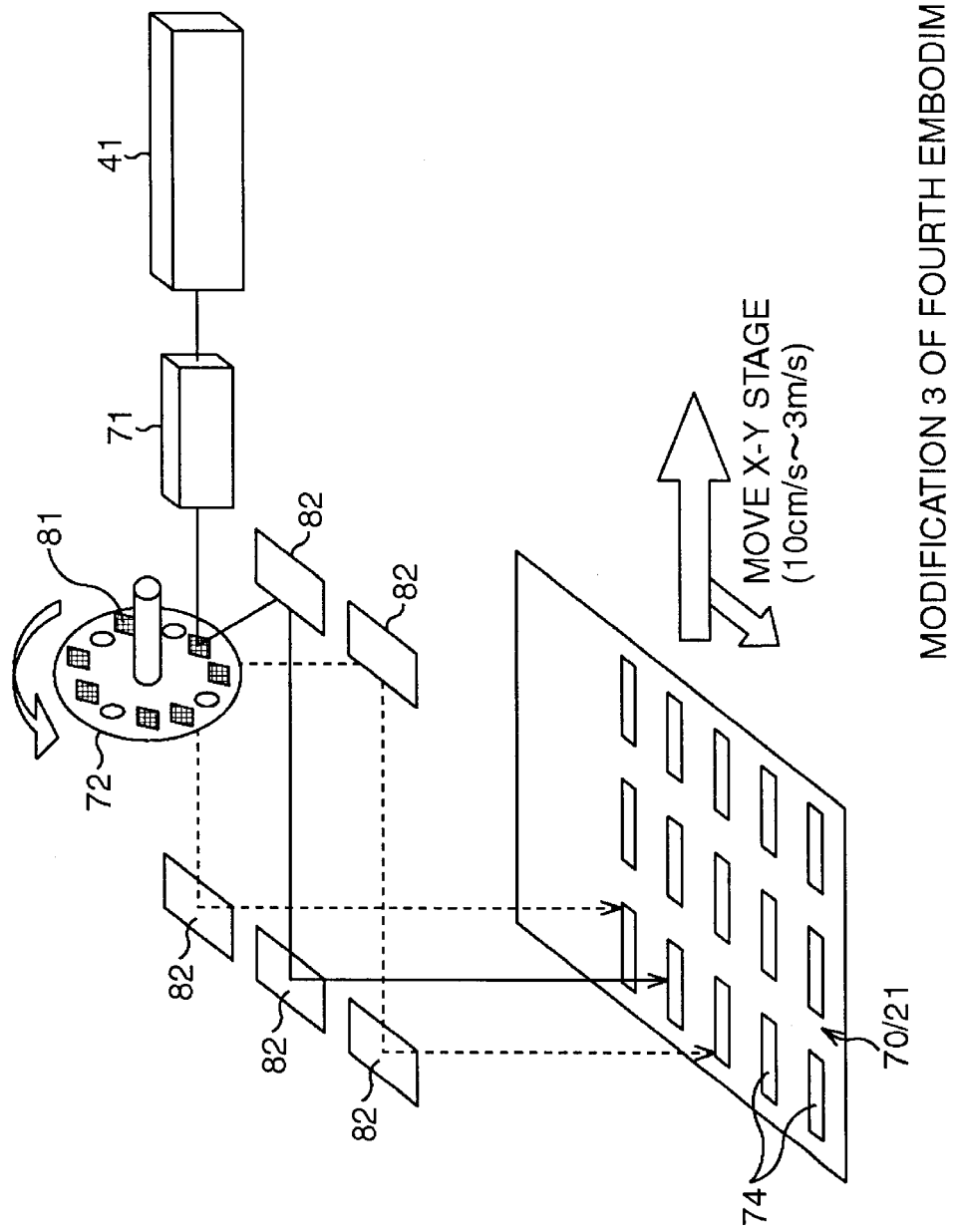
FIG. 30 is a schematic view showing the principal part of a DPSS laser device according to modification 3 of the fourth embodiment.

FIG. 30 is a schematic view showing the principal part of a DPSS laser device according to this modification 3.

The DPSS laser device of this modification has almost the same construction as that in the third embodiment, but differs on the point that the chopper 72 is processed and, attendant upon this, a number of mirrors are disposed.

In this modification, predetermined ones of the ON areas 72a of the chopper 72 are stopped with interruption plates 81 that can reflect the energy beam. A number of mirrors 82 are provided for reflecting the energy beam reflected on the respective interruption plates 81, in predetermined directions. By this structure, the energy beam reflected on an interruption plate 81 is turned to irradiate a neighboring line of the a-Si film 70 and further the next neighboring line. In case of a pixel size of 50 μm×150 μm and a TFT region size of 15 μm×10 μm as shown in FIG. 28, about two-thirds of one scanning period is in the OFF state. By irradiating the neighboring two lines during this OFF period, three lines can be irradiated for every scanning period. Thus, the process time can be shortened to about one-third.

During one scanning period with the X–Y stage 43, the non-irradiation time is several times longer than the irradiation time, so the energy beam is rapidly moved to the neighboring line one after another during the non-irradiation time. The idle time can be reduced thereby and the throughput can be improved.

As described above, according to this modification, by restricting the energy beam of the CW laser to 100 μm or less and applying it intermittently, a large-grain crystal can be formed without damaging the glass substrate and peeling off the film. Besides, by irradiating the neighboring lines during the non-irradiation time of one line, the several lines can be crystallized during every scanning period, thereby improving the throughput. This makes it possible to suppress unevenness of the TFT characteristics dependent upon crystal grain boundaries or size, and good element characteristics can be obtained. As a result, a high-quality liquid crystal display device with its drive circuit being incorporated therein can be provided.

(Modification 4)

Figure 31:
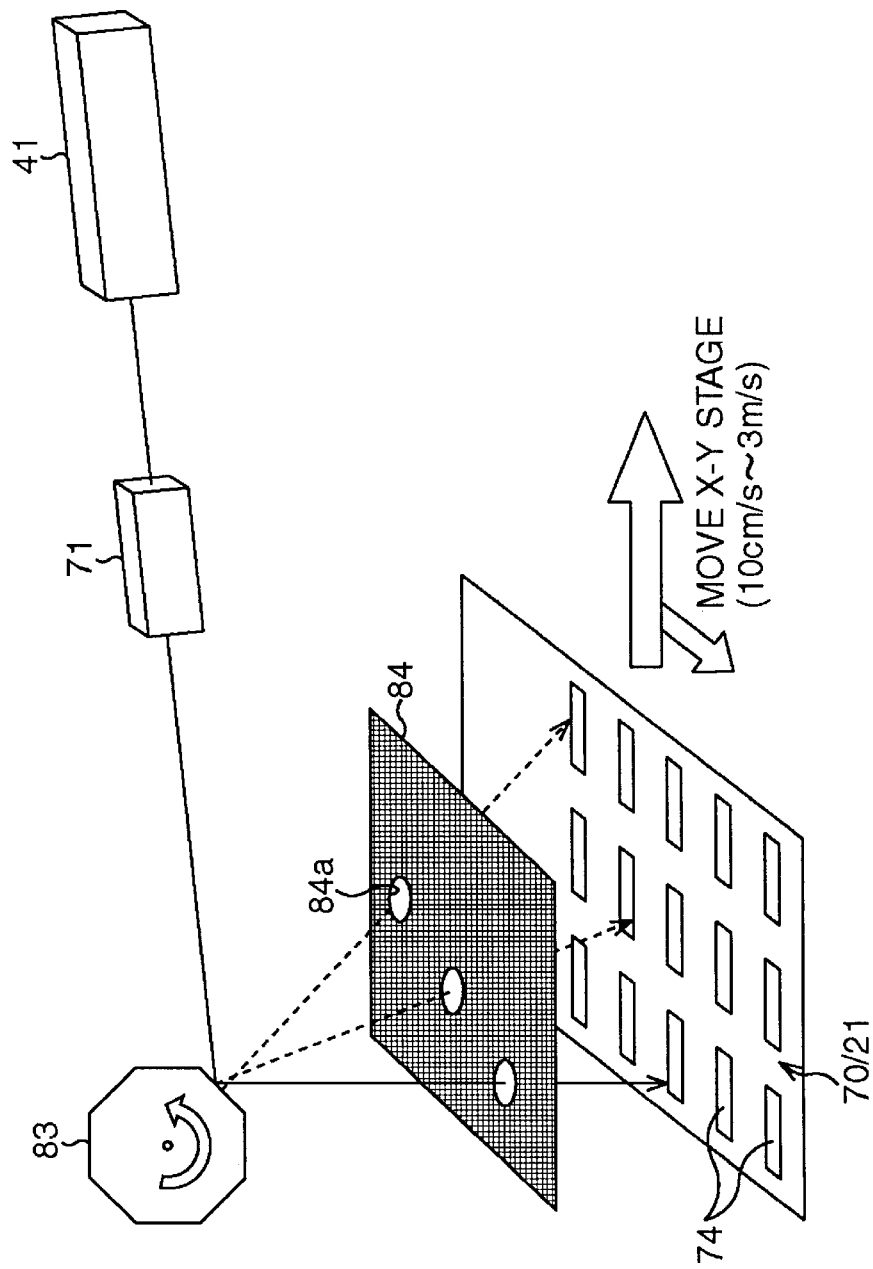
FIG. 31 is a schematic view showing the principal part of a DPSS laser device according to modification 4 of the fourth embodiment.

FIG. 31 is a schematic view showing the principal part of a DPSS laser device according to this modification 4.

The DPSS laser device of this modification has almost the same construction as that in modification 3, but differs on the point that a polygon mirror is used in place of the chopper 72.

In addition to the DPSS laser 41 and the optical system 71, the DPSS laser device of this modification includes a polygon mirror 83 in place of the chopper 72, and an interruption board 84 having a number of (in the illustrated example, three) holes 84a for allowing only the energy beams in predetermined directions to pass, in accordance with the directions of the energy beam reflected on the polygon mirror 83.

In this modification, the polygon mirror 83 is rotated to swing the energy beam, and thereby three lines on the a-Si film 70 are irradiated at once during one scanning period. But, after the first line is irradiated, since the X–Y stage 43 has moved, the irradiation portion of the second line (the position of the hole 84a) must be located at the position advanced in accordance with the movement of the X–Y stage 43. The same applies also to the third line.

According to this modification, like modification 3, a large-grain crystal can be formed without damaging the glass substrate and peeling off the film. Besides, by irradiating the neighboring lines during the non-irradiation time of one line, the several lines can be crystallized during every scanning period, thereby improving the throughput.

On the fourth embodiment and its modifications 1 to 4, as shown in FIG. 27 to FIG. 31, the energy beam is scanning the X–Y stage to be moved in the bold arrow direction. When one line is scanned, the energy beam is moved in the narrow arrow direction to scan next line.

(Fifth Embodiment)

Next, the fifth embodiment of the present invention will be described.

In this embodiment, for making TFTs, an a-Si film is crystallized with a CW laser, like the first to fourth embodiments. At this time, this embodiment is aimed principally at preventing peeling-off of the a-Si film, which is caused by the temperature rising of a buffer layer due to irradiation with the energy beam. This embodiment discloses TFTs with a proper buffer layer.

Figure 32:
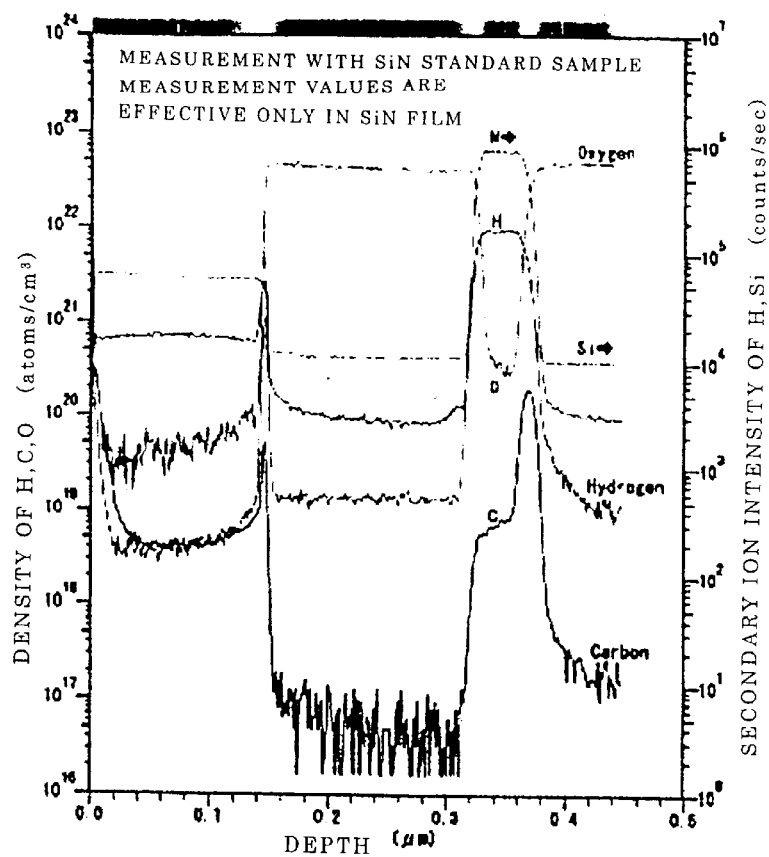
FIG. 32 is a graph showing a result obtained by examining the distribution of hydrogen in a buffer layer made of SiN or SiON, and a Si layer.

It is known that the use of SiN or SiON as the material of the buffer layer formed between the glass substrate and the a-Si film is effective for preventing contamination by impurities such as sodium from the glass constituting the substrate. FIG. 32 shows a result obtained by examining the distribution of hydrogen in a buffer layer that is not modified after it is formed.

Figure 33:
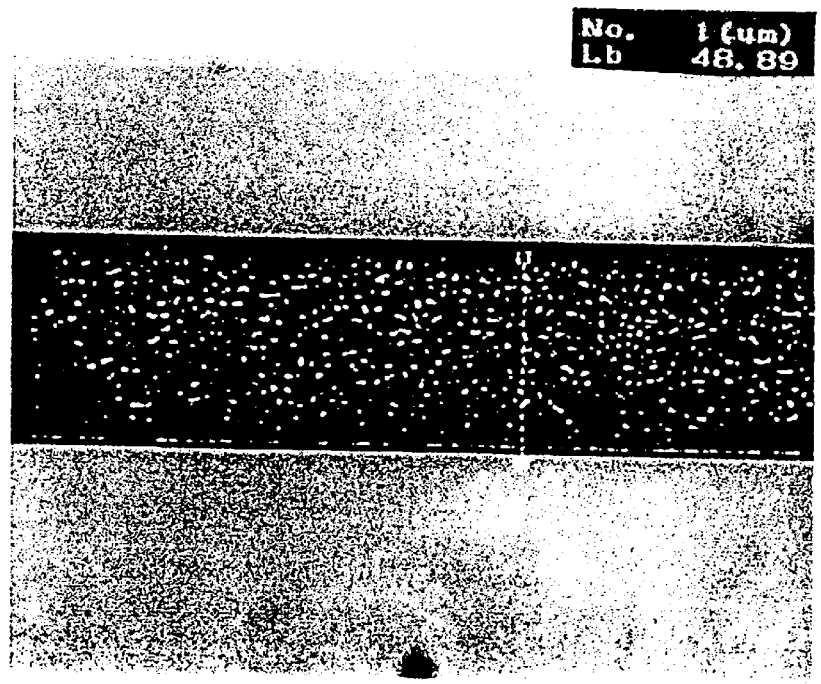
FIG. 33 is a photomicrographic view showing a state of an a-Si film peeling off.

When an a-Si film formed over a substrate with a buffer layer being interposed between them, which layer contains SiN or SiON, is crystallized with an energy beam that generates energy continuously in relation to time, in this example, a CW laser, because the buffer layer absorbs the energy beam (or due to thermal conduction when the a-Si film is melted), the temperature rises. When the density of hydrogen in the buffer layer is high, effusion of hydrogen atoms occurs to generate pinholes, which causes peeling-off of the film. Also, when the density of hydrogen in the a-Si film is high, effusion occurs to generate pinholes. When both the densities are high, as shown in FIG. 33, the a-Si film is peeled off due to pinholes. This phenomenon is remarkable particularly when using a continuous energy beam, in comparison with the crystallization using a conventional excimer laser.

Figure 34:
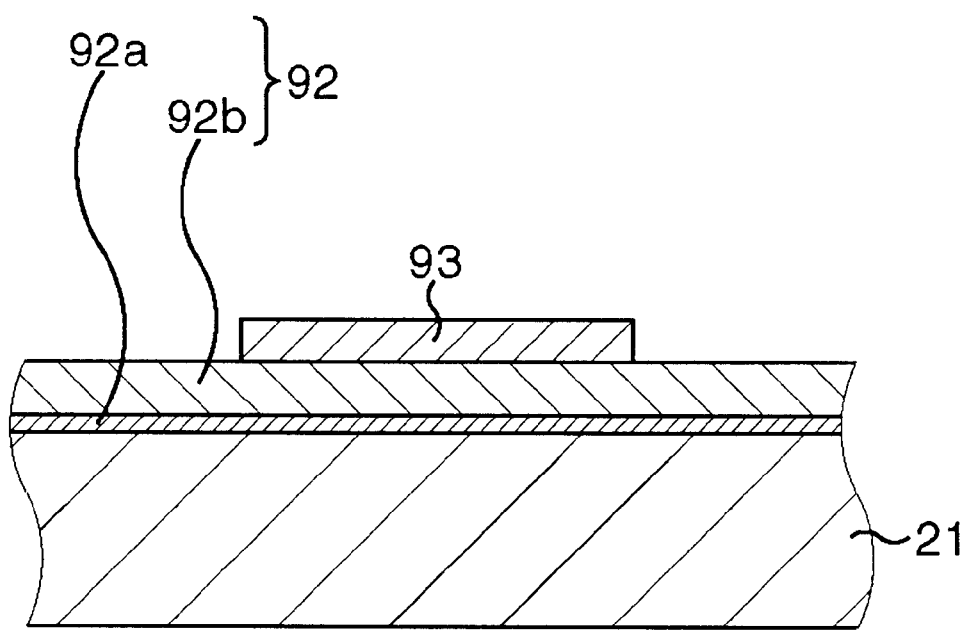
FIG. 34 is a schematic sectional view showing a state that an a-Si film is formed over a glass substrate with a buffer layer being interposed between them.

So, in this embodiment, as shown in FIG. 34, an a-Si film 93 is formed over a glass substrate 91 with a buffer layer 92 being interposed between them. The buffer layer 92 is a multilayer film made up from a thin SiN or SiON film 92a having a thickness of about 40 nm and a $SiO_2$ film 92b. Prior to crystallization of the a-Si film 93 with a CW laser, the density of hydrogen in either of the a-Si film 93 and the thin film 92a is regulated. More specifically, the density of hydrogen in the a-Si film 93 is regulated to $1 \times 10^{20}/cm^3$ or less, and the density of hydrogen in the thin film 92a is regulated to $1 \times 10^{22}/cm^3$ or less. By providing the $SiO_2$ film 92b, interface state density between Si film and buffer layer can be reduced. Besides, upon irradiation with the energy beam of the CW laser, irradiation from the upper surface side of the substrate is preferable to irradiation from the lower surface side of the substrate because SiN is not directly irradiated with the laser light.

[Proper Density of Hydrogen in a-Si Film]

Here will be described an experimental result obtained by examining the proper density of hydrogen in the a-Si film.

As shown in FIG. 34, a thin SiN film 92a having a thickness of about 50 nm and then a $SiO_2$ film 92b having a thickness of about 200 nm were formed on a glass substrate 91 through a P-CVD process to form a buffer layer 92. An a-Si film 93 having a thickness of about 150 nm was then formed thereon. The thickness of each film is not limited to the above value.

Subsequently, the a-Si film 93 was dehydrogenated by a thermal treatment in a nitrogen atmosphere at 500° C. for two hours. After this, crystallization was performed with a semiconductor-exciting (LD-exciting) solid state laser (DPSS laser) Nd:YVO$_4$ under conditions of an output of 6.5 W, a scanning speed of 20 cm/sec, and a wavelength of 532 nm (the second harmonic of Nd:YVO$_4$). Scanning was performed by moving the X–Y stage.

Figure 35:
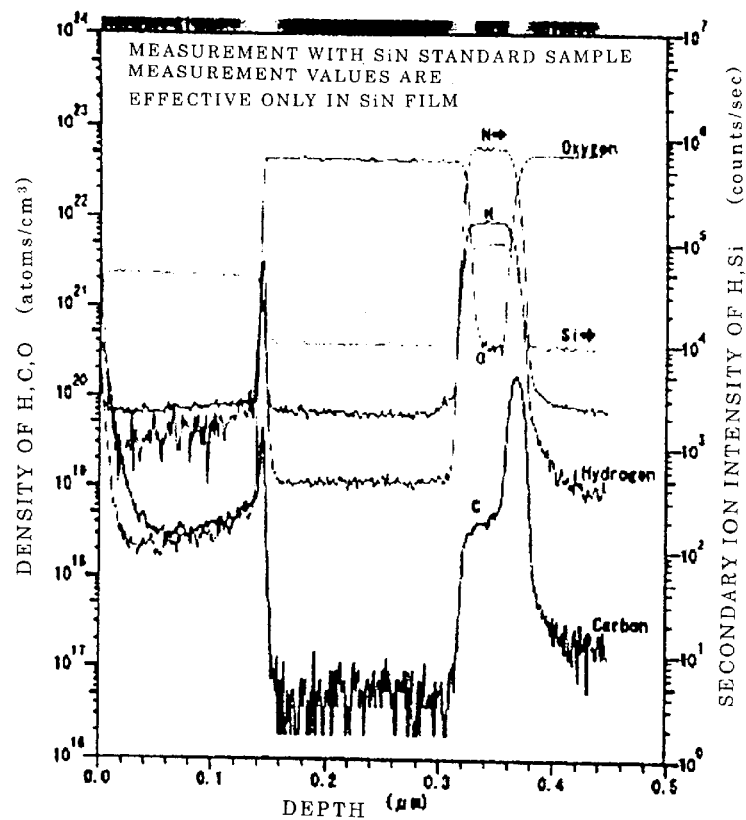
FIG. 35 is a graph showing an result of an SIMS analysis of a glass substrate/SiN/SiO$_2$/a-Si structure after a thermal treatment at 500° C. for two hours.

FIG. 35 is a graph showing an result of an SIMS analysis of the glass substrate/SiN/SiO$_2$/a-Si structure after the thermal treatment at 500° C. for two hours.

In this SIMS analysis, after the thermal treatment at 500° C. for two hours, it was confirmed that the density of hydrogen in the a-Si film 93 became $1 \times 10^{20}/cm^3$ or less.

Figure 36:
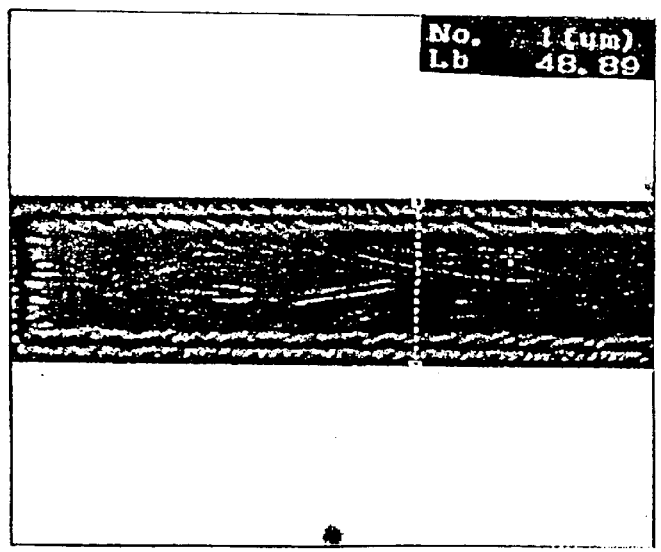
FIG. 36 is a photomicrographic view showing a semiconductor film after crystallization.

FIG. 36 is a photomicrographic view showing the semiconductor film after crystallization.

It is found that a good crystal without pinholes and peeling-off could be obtained by regulating the density of hydrogen in the a-Si film 93 to $1 \times 10^{20}/cm^3$ or less.

[Proper Density of Hydrogen in SiN Film]

Next will be described an experimental result obtained by examining the proper density of hydrogen in the SiN film constituting the buffer layer.

As shown in FIG. 34, a thin SiN film 92a having a thickness of about 50 nm and then a SiO$_2$ film 92b having a thickness of about 200 nm were formed on a glass substrate 91 through a P-CVD process to form a buffer layer 92. An a-Si film 93 having a thickness of about 150 nm was then formed thereon. The thickness of each film is not limited to the above value.

Subsequently, the a-Si film 93 was dehydrogenated by a thermal treatment in a nitrogen atmosphere at 450° C. for two hours. In a SIMS analysis, it was confirmed that the density of hydrogen in the thin SiN film 92a became $1 \times 10^{22}/cm^3$ or less. At this time, the density of hydrogen in the a-Si film 93 was $1 \times 10^{20}/cm^3$ or less.

The a-Si film 93 was then crystallized with a semiconductor-exciting (LD-exciting) solid state laser (DPSS laser) Nd:YVO$_4$ under conditions of an output of 6.5 W, a scanning speed of 20 cm/sec, and a wavelength of 532 nm (the second harmonic of Nd:YVO$_4$). Scanning was performed by moving the X–Y stage. As a result, a good crystal was obtained like in FIG. 36.

As described above, according to this embodiment, it becomes possible to unformize the transistor characteristics of TFTs at a high level using crystallization with an energy beam that outputs energy continuously in relation to time, and to stably form the TFTs without generation of pinholes and peeling-off, thereby realizing the very highly reliable TFTs.

In the above-described embodiments, the a-Si film is used as the semiconductor film. However, the present invention is applicable also to any case wherein the initial film is a p-Si film formed through an LPCVD process, a p-Si film by solid phase growth, a p-Si film by metal-induced solid phase growth, or the like.

The present invention can implement TFTs in which the transistor characteristics of the TFTs are made uniform at high level, and the mobility is high particularly in the peripheral circuit region to enable high-speed driving in applications to a peripheral circuit-integrated TFT-LCD, system-on panel, system-on glass, and the like.

Further, according to the present invention, it becomes possible that the insufficiency of the output of an energy beam, which outputs energy continuously in relation to time, is compensated so that the throughput in crystallization of semiconductor films is improved, thereby realizing highly efficient TFTs whose mobility is high particularly in a peripheral circuit region to enable high-speed driving.

What is claimed is:

1. A semiconductor device comprising:

a substrate;

a pixel region formed on said substrate and including thin film transistors; and a peripheral circuit region about said pixel region, said peripheral circuit region being formed on said substrate and including thin film transistors, wherein each of active semiconductor films of said thin film transistors in said peripheral circuit region is formed into a crystalline state having a streamlined flow pattern with large crystal grains.

2. The device according to claim 1, wherein the grain size of said flow pattern is longer than a channel length.

3. The device according to claim 2, wherein said active semiconductor films have been formed by applying an energy beam to semiconductor films patterned on said substrate into lines or islands.

4. The device according to claim 3, wherein markers for positional adjustment of irradiation with said energy beam are provided on said substrate to correspond respectively to said semiconductor films patterned.

5. The device according to claim 1, wherein said active semiconductor films in said peripheral circuit region are different in thickness from active semiconductor films in said pixel region.

6. The device according to claim 1, wherein said substrate is made of one selected from the group of non-alkali glass, quartz glass, ceramic, plastic, and monocrystalline silicon with amorphous insulating film.

7. The device according to claim 1, wherein a semiconductor film is formed over said substrate with a buffer layer being interposed between them, said layer including a thin film containing Si and N, or Si, O, and N, and the density of hydrogen in said semiconductor film is not more than $1 \times 10^{20}/cm^3$.

8. The device according to claim 7, wherein the density of hydrogen in said thin film is not more than $1 \times 10^{22}/cm^3$.

9. The device according to claim 7, wherein said buffer layer has a structure of SiO$_2$/SiN or SiO$_2$/SiON.

* * * * *

UNITED STATES PATENT AND TRADEMARK OFFICE
CERTIFICATE OF CORRECTION

PATENT NO. : 6,737,672 B2 Page 1 of 1
DATED : May 18, 2004
INVENTOR(S) : Hara et al.

It is certified that error appears in the above-identified patent and that said Letters Patent is hereby corrected as shown below:

<u>Title page, Item [54] and Column 1, line 2,</u>
Title, delete "THEREOF" and insert -- THEREFOR --.

Signed and Sealed this

Seventh Day of September, 2004

JON W. DUDAS
*Director of the United States Patent and Trademark Office*